(12) United States Patent
Tanida et al.

(10) Patent No.: US 7,282,444 B2
(45) Date of Patent: Oct. 16, 2007

(54) SEMICONDUCTOR CHIP AND MANUFACTURING METHOD FOR THE SAME, AND SEMICONDUCTOR DEVICE

(75) Inventors: Kazumasa Tanida, Kyoto (JP); Mitsuo Umemoto, Moriguchi (JP); Yoshihiko Nemoto, Tokyo (JP); Kenji Takahashi, Ibaraki (JP)

(73) Assignees: Rohm Co., Ltd., Kyoto (JP); Renesas Technology Corp., Tokyo (JP); Sanyo Electric Co., Ltd., Osaka (JP); Kabushiki Kaisha Toshiba, Tokyo (JP)

( * ) Notice: Subject to any disclaimer, the term of this patent is extended or adjusted under 35 U.S.C. 154(b) by 207 days.

(21) Appl. No.: 11/003,769

(22) Filed: Dec. 6, 2004

(65) Prior Publication Data
US 2005/0151228 A1 Jul. 14, 2005

(30) Foreign Application Priority Data
Dec. 4, 2003 (JP) .............................. 2003-406446

(51) Int. Cl.
*H01L 21/44* (2006.01)
(52) U.S. Cl. ............... 438/667; 257/698; 257/E21.597; 438/589
(58) Field of Classification Search ................ 438/667, 438/589, 459; 257/698, E21.597
See application file for complete search history.

(56) References Cited
U.S. PATENT DOCUMENTS
5,786,270 A * 7/1998 Gorrell et al. ............... 438/613
5,814,889 A * 9/1998 Gaul .......................... 257/773
6,583,030 B1 6/2003 Grassl ........................ 438/459
6,809,421 B1 10/2004 Hayasaka et al. ............ 257/777
2002/0094449 A1 7/2002 Takeuchi et al. ............ 428/647

FOREIGN PATENT DOCUMENTS

| | | |
|---|---|---|
| JP | 10-223833 | 8/1998 |
| JP | 2000-299350 | 10/2000 |
| JP | 2001-053218 | 2/2001 |
| JP | 2001-319940 | 11/2001 |
| JP | 2002-167676 | 6/2002 |
| JP | 2002-530891 | 9/2002 |

* cited by examiner

*Primary Examiner*—Caridad Everhart
(74) *Attorney, Agent, or Firm*—Rabin & Berdo, PC

(57) ABSTRACT

The invention provides a semiconductor chip manufacturing method including the steps of: forming a concave portion extended in the thickness direction of a semiconductor substrate which has a front surface and a rear surface and has a function device formed on the front surface, from the front surface; forming an oxidation preventive film made of an inert first metal material by supplying the first metal material onto the inner wall surface of the concave portion; supplying a second metal material containing a metal which is oxidized more easily than the first metal material to the inside of the concave portion after the step of forming the oxidation preventive film; electrically connecting the second metal material supplied to the inside of the concave portion and the function device; and thinning the semiconductor substrate so that the thickness thereof becomes thinner than the depth of the concave portion by removing the semiconductor substrate from the rear surface while leaving the oxidation preventive film.

24 Claims, 22 Drawing Sheets

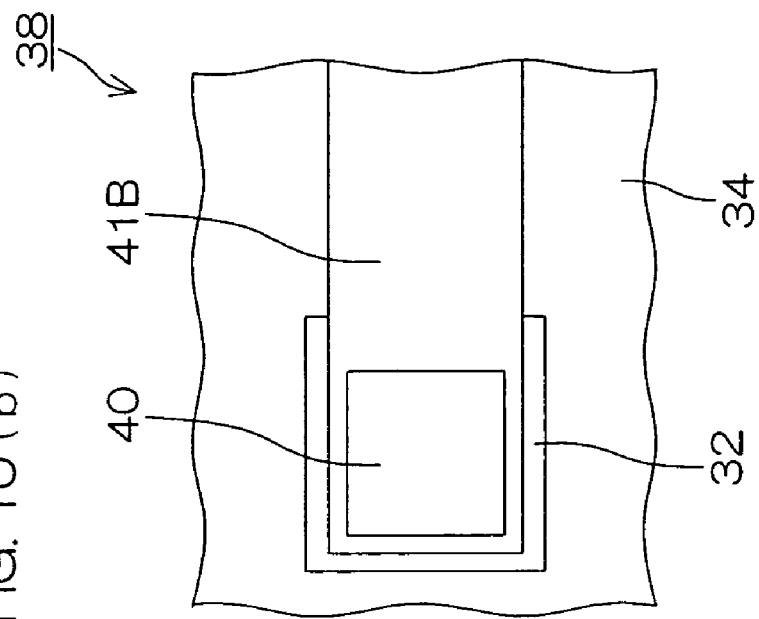
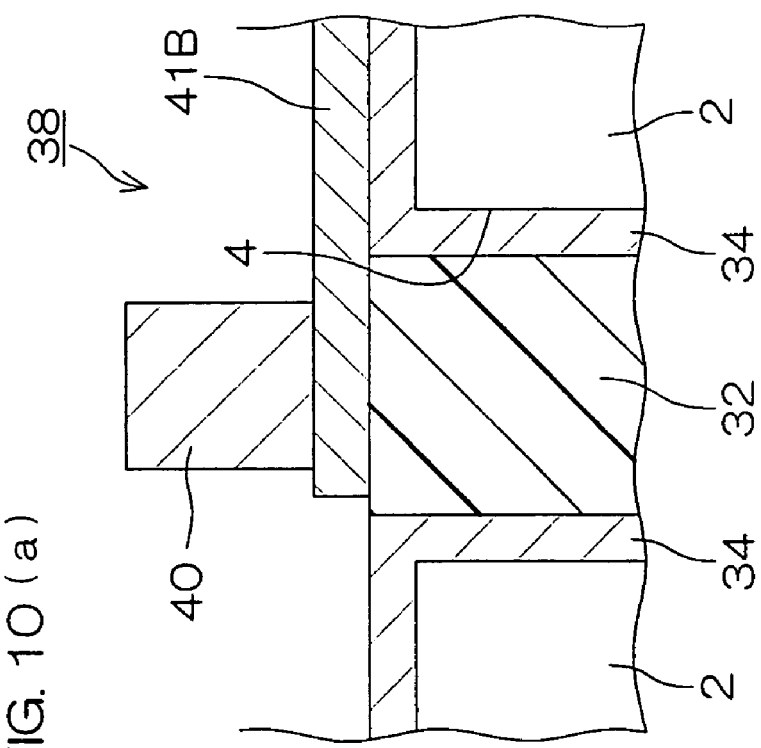
FIG. 10(a)
FIG. 10(b)

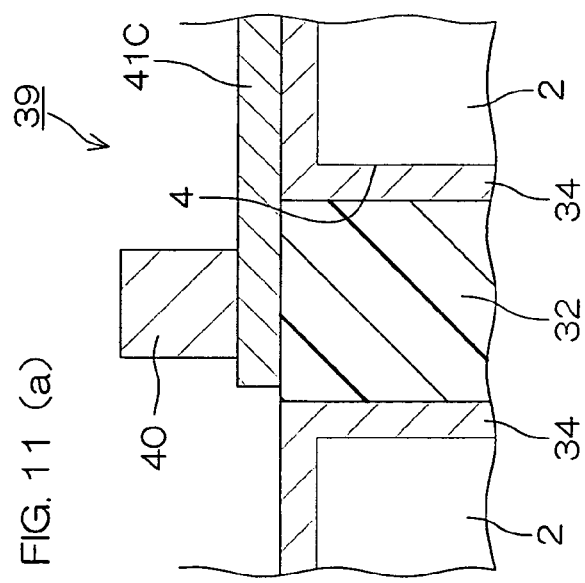
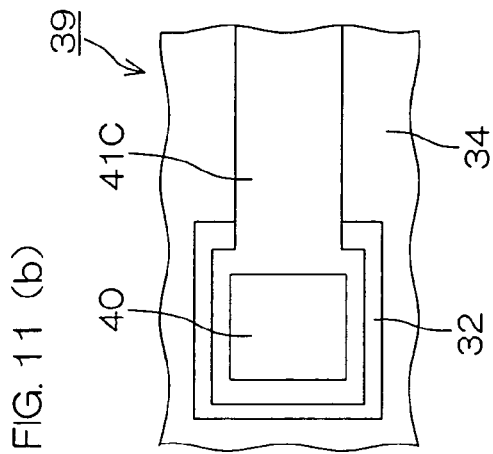
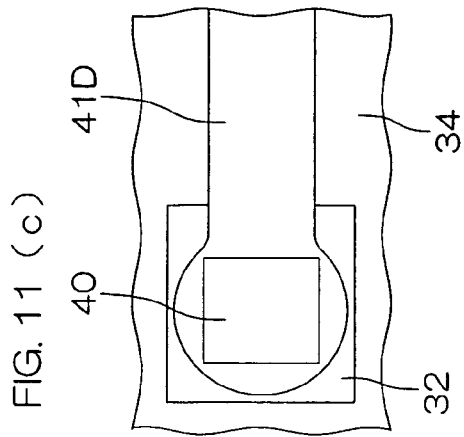

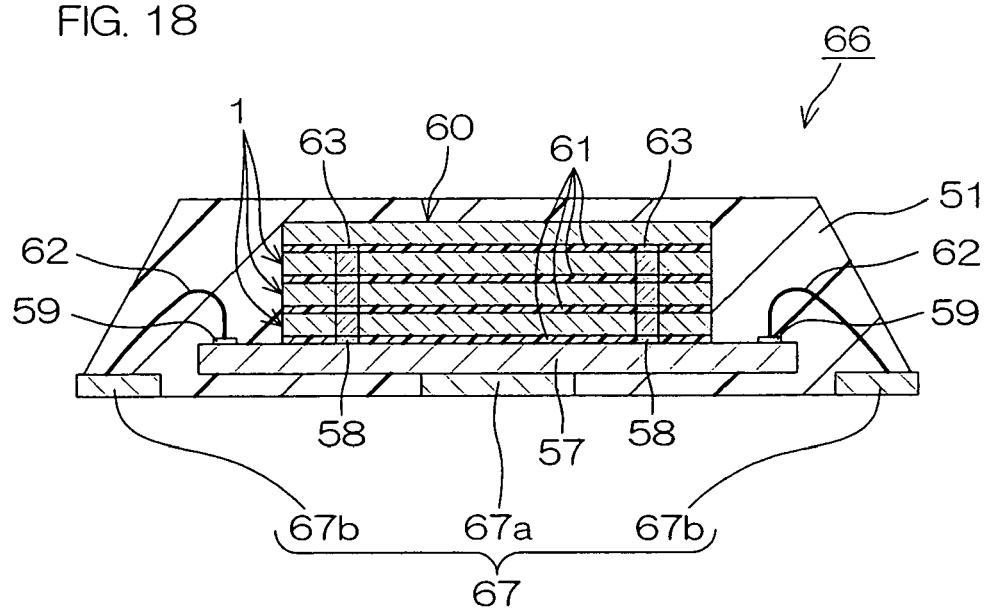
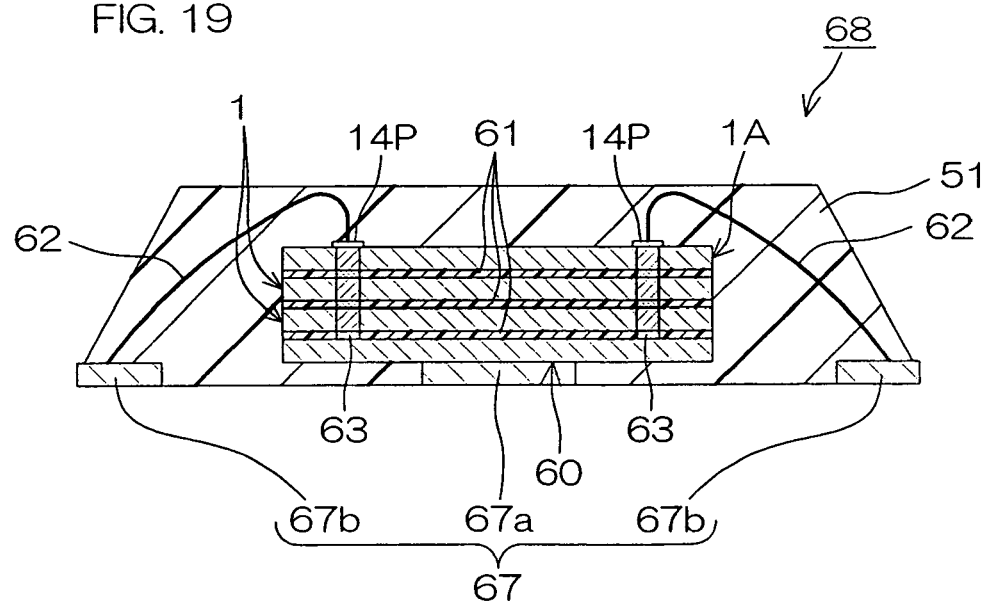

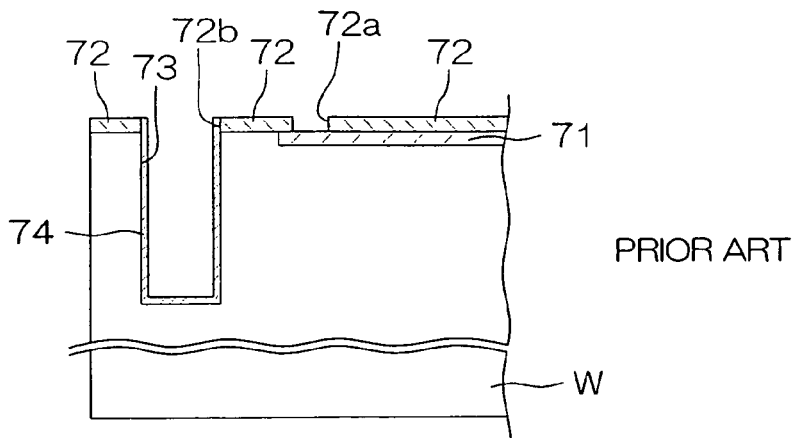
FIG. 21 (a) PRIOR ART
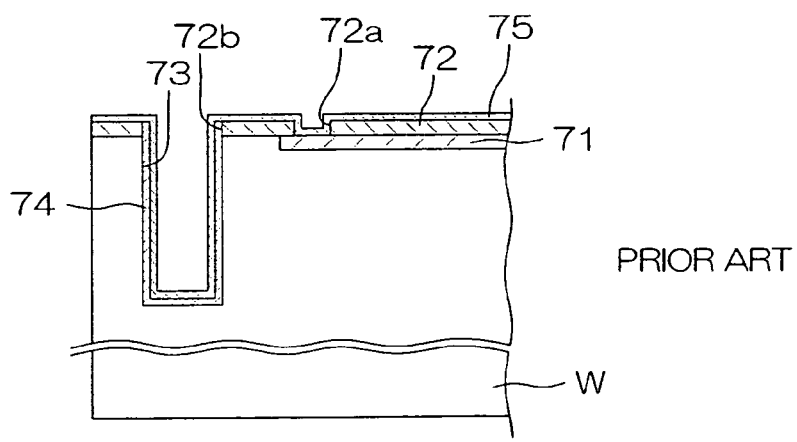
FIG. 21 (b) PRIOR ART
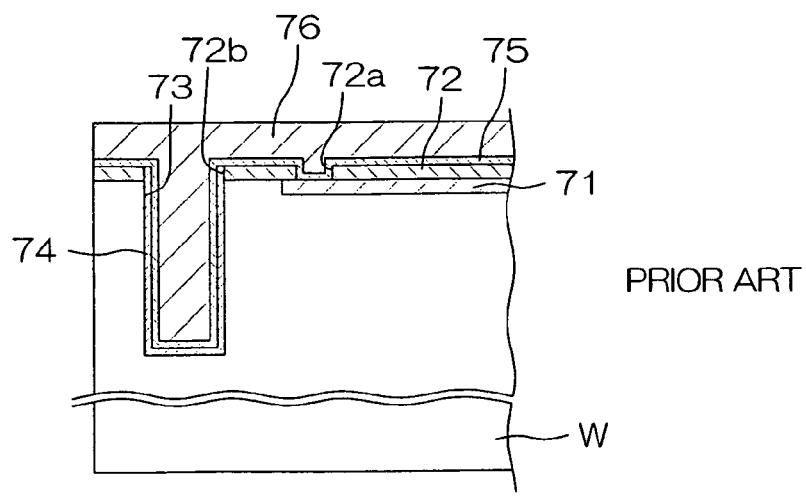
FIG. 21 (c) PRIOR ART

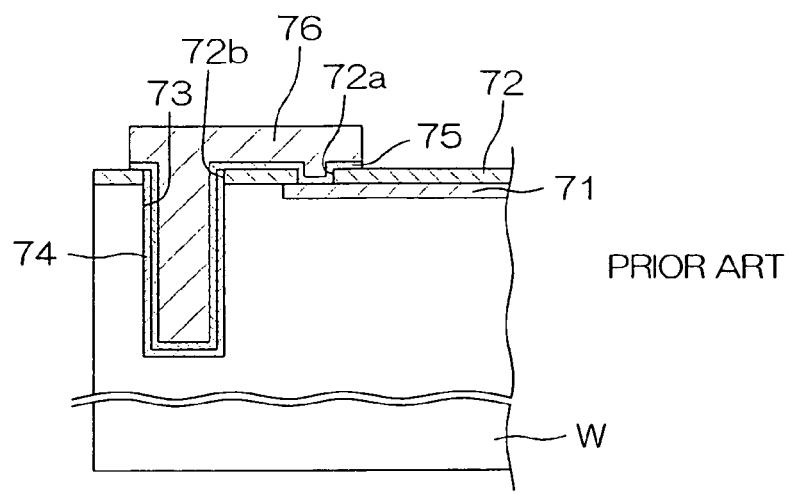
FIG. 21 (d) PRIOR ART
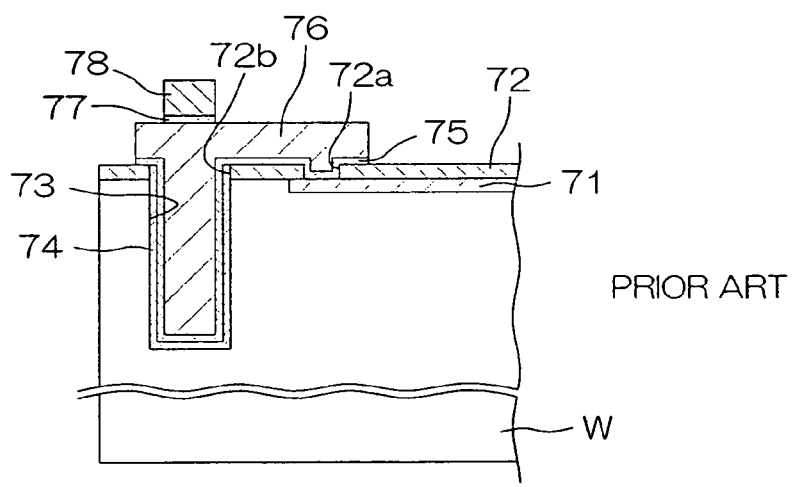
FIG. 21 (e) PRIOR ART
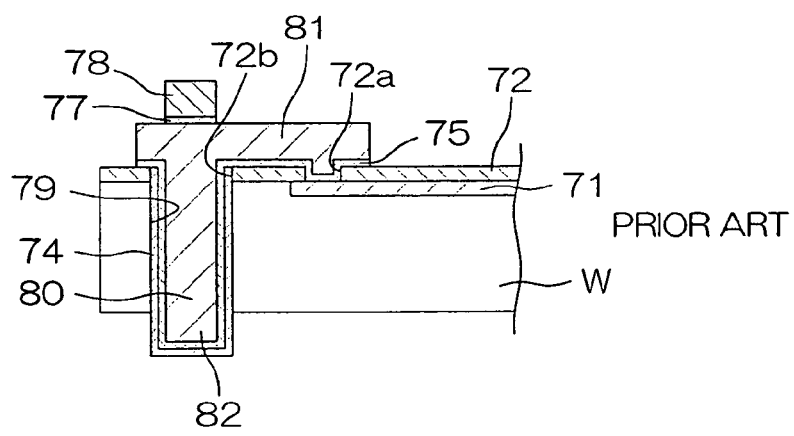
FIG. 21 (f) PRIOR ART

PRIOR ART

SEMICONDUCTOR CHIP AND MANUFACTURING METHOD FOR THE SAME, AND SEMICONDUCTOR DEVICE

BACKGROUND OF THE INVENTION

1. Field of the Invention

This invention relates to semiconductor chip having protruding electrode and manufacturing method for the same, and multi-chip semiconductor device equipped with a plurality of semiconductor chips having protruding electrodes.

2. Description of Related Art

FIG. 20 is an illustrative sectional view showing the structure of a semiconductor chip having a conventional penetrating electrode.

This semiconductor chip 91 includes a semiconductor substrate 90 made of silicon (Si). On one surface (hereinafter, referred to as "front surface") of the semiconductor substrate 90, a function device 71 having a plurality of electrodes is formed. By the side of the function device 71, a through hole 79 penetrating the semiconductor substrate 90 in the thickness direction is formed.

On the front surface of the semiconductor substrate 90, a hard mask 72 having openings 72a and 72b is formed. The hard mask 72 is made of silicon oxide ($SiO_2$). In the vertical top plan view of the semiconductor substrate 90, inside the opening 72a, an electrode of the function device 71 exists, and the opening 72b and the through hole 79 form one hole having a continuous inner wall surface.

On the inner wall surface of the through hole 79 and the opening 72b, an insulating film 74 made of silicon oxide is formed. In a predetermined region including the surface of the insulating film 74, the inside of the opening 72a, and the surface of the hard mask 72 between the opening 72b and the opening 72a, a continuous diffusion preventive film 75 made of tantalum nitride (TaN) or titanium nitride (TiN) is formed.

The insides of the through hole 79 and the opening 72b are filled with a penetrating electrode 80. On the surface opposite the front surface of the semiconductor substrate 90 (hereinafter, referred to as "rear surface"), a rear side protruding electrode 82 protruding from the rear surface is formed integrally with the penetrating electrode 80. The penetrating electrode 80 and the rear side protruding electrode 82 are made of copper. The rear side protruding electrode 82 is formed so as to almost overlap the penetrating electrode 80 in the vertical top plan view of the semiconductor substrate 90.

The tip end part of the rear side protruding electrode 82 and the vicinity thereof are covered by a low melting point metal layer 83 made of a low melting point metal such as tin (Sn).

On the front surface of the semiconductor substrate 90, an interconnection member 81 that is made of copper and integral with the penetrating electrode 80 is provided on the penetrating electrode 80 and on the diffusion protective film 75 except for the surfaces of the through hole 79 and the opening 72b. The electrode of the function device 71 exposed to the inside of the opening 72a is electrically connected to the rear side protruding electrode 82 through the diffusion preventive film 75, the interconnection member 81, and the penetrating electrode 80.

On the interconnection member 81, a front side protruding electrode (bump) 78 made of a metal (for example, gold (Au)) is formed through a UBM (Under Bump Metal) layer 77 made of titanium tungsten (TiW) or titanium. The front side protruding electrode 78 is almost right above the penetrating electrode 80 (so as to overlap the rear side protruding electrode 82 in the vertical top plan view of the semiconductor substrate 90).

In this semiconductor chip 91, the interconnection length between the front surface side and the rear surface side of the semiconductor substrate 90 is shortened by the penetrating electrode 80 penetrating the semiconductor substrate 90.

Furthermore, in this semiconductor chip 91, electrical connection from the front surface side of the semiconductor chip 91 to the function device 71 through the front side protruding electrode 78 is possible, and electrical connection from the rear side of the semiconductor chip 91 via the rear side protruding electrode 82 is also possible. In detail, this semiconductor chip 91 can be joined to an electrode pad, etc., formed on a wiring board via the rear side protruding electrode 82. Furthermore, by layering semiconductor chips in the vertical direction and joining the front side protruding electrode 78 and the rear side protruding electrode 82 of the adjacent semiconductor chips, the semiconductor chips 91 can be electrically connected to each other.

When the rear side protruding electrode 82 is joined to an electrode pad, etc., formed on a wiring board, or the front side protruding electrode 78 of another semiconductor chip, by setting the temperature of the semiconductor chip 91 to be equal to or higher than the melting point (solidus temperature) of the low melting point metal forming the low melting point metal layer 83 for a proper period of time, a melt of the low melting point metal can be produced. Thereby, the rear side protruding electrode 82 and the electrode pad or the front side protruding electrode 78 of another semiconductor chip 91 are joined to each other via the low melting point metal layer 83.

FIG. 21(a) through FIG. 21(h) are illustrative sectional views describing a manufacturing method for the semiconductor chip 91 shown in FIG. 20. Such a manufacturing method is disclosed in Unexamined Japanese Patent Application No. 2001-53218.

On the front surface of a semiconductor wafer w (hereinafter, referred to as "wafer," simply) having a function device 71 formed on the front surface, a hard mask 72 having openings 72a and 72b at predetermined portions is formed. Inside the opening 72a, the electrode of the function device 71 is exposed. Inside the opening 72b, a predetermined region of the wafer W in which the function device 71 is not formed is exposed.

Next, in the wafer W exposed inside the opening 72b, a concave portion 73 is formed by reactive ion etching (RIE). At this time, the opening 72a is closed by a resist so as to prevent the function device 71 from being etched. Next, an insulating film 74 is formed on the inner surface of the concave portion 73 by the CVD (Chemical Vapor Deposition) method. This condition is shown in FIG. 21(a). Next, on the entire exposed surface of the wafer W front surface side including the insides of the openings 72a and 72b and the inside of the concave portion 73, a diffusion preventive film 75 is formed (see FIG. 21(b)).

Then, on this diffusion preventive film 75, a seed layer made of copper (not shown) is formed, and then the entire exposed surface of the wafer W front surface side is supplied with a metal material (copper) 76 for forming the interconnection member 81, the protruding electrode 80, and the rear side protruding electrode 82.

Thereby, the insides of the openings 72a and 72b and the concave portion 73 are almost completely filled with the metal material 76. The metal material 76 is electrically connected to the electrode of the function device 71 exposed inside the opening 72a of the hard mask 72. The metal material 76 is also supplied to the outsides of the openings 72a and 72b and the concave portion 73 so as to be continuously disposed from the inside of the opening 72a to the insides of the opening 72b and the concave portion 73. This condition is shown in FIG. 21(c).

Next, by using a mask with a predetermined pattern, a portion except for a predetermined region including the concave portion 73 (opening 72b) and the opening 72a of the metal material 76 and the diffusion preventive film 75 in the vertical top plan view of the wafer W is removed by etching. This condition is shown in FIG. 21(d). Thereafter, as appropriate, a surface protective film for protecting the metal material 76 is formed so as to cover the metal material 76.

Next, on the metal material 76, in a region of the surface of the metal material 76 almost overlapping the concave portion 73 in a vertical top plan view of the wafer W, a UBM layer 77 and a front side protruding electrode (bump) 78 are formed in order (see FIG. 21(e)). When the metal material 76 is covered by the surface protective film, prior to formation of the UBM layer 77, the surface protective film is made not to exist in the region for forming the front side protruding electrode 78.

Next, the rear surface of the wafer W is dry-etched and reduced in thickness to be smaller than the depth of the concave portion 73. This step is performed by setting the etching rate for the insulating film 74 to be lower than the etching rate for the wafer W. Thereby, the concave portion 73 is formed into a through hole 79 penetrating the wafer W in the thickness direction, and the metal material 76 disposed inside the concave portion 73 serves as a penetrating electrode 80 that electrically connects the front surface side and the rear surface side of the wafer W.

Apart of the metal material 76 disposed inside the concave portion 73 becomes a rear side protruding electrode 82 protruding from the rear surface of the wafer W while being covered by the insulating film 74 and the diffusion preventive film 75. The remainder of the metal material 76 becomes an interconnection member 81 that electrically connects the penetrating electrode 80 and the electrode of the function device 71. This condition is shown in FIG. 21(f).

Next, the insulating film 74 exposed to the rear surface of the wafer W is removed by etching. Thereby, as shown in FIG. 21(g), the diffusion preventive film 75 covering the rear side protruding electrode 82 is exposed. Furthermore, the diffusion preventive film 75 covering the rear side protruding electrode 82 is removed by etching, and the tip end part of the rear side protruding electrode 82 and the vicinity thereof are exposed (see FIG. 21(h)).

Thereafter, on the exposed surface of the rear side protruding electrode 82, a low melting point metal layer 83 is formed by means of, for example, electrolytic plating, and the wafer W is cut into pieces of semiconductor chips 91 having the penetrating electrodes 80 shown in FIG. 20.

However, if such a semiconductor chip 91 is left in the atmosphere, on the surface of the low melting point metal layer 83 made of tin, etc., an oxide film is easily formed. The oxide film is not wetted by the melt of the low melting point metal, so that the area that substantially contributes to junction between the rear side protruding electrode 82 and an electrode pad or the front side protruding electrode 78 of another semiconductor chip 91 becomes smaller.

Thereby, the junction strength and electrical connection reliability between the semiconductor chip and a wiring board or another semiconductor chip are lowered.

Furthermore, if an activator such as a flux is used for removing the oxide film, migration due to impure ions caused by the activator occurs and this may cause an electrical shortcircuit, or nonmetal materials may become mixed in the junction interface between the rear side protruding electrode 82 and the electrode pad or the like and lower the connection reliability.

Furthermore, in the case where a plurality of semiconductor chips 91 are stacked in the thickness direction and the front side protruding electrode 78 and the rear side protruding electrode 82 of two adjacent semiconductor chips 91 are joined to each other, if a stress is applied between these semiconductor chips 91, this stress concentrates in the vicinity of the low melting point metal layer 83 that is the junction portion.

As shown in FIG. 20, in some of the semiconductor chips 91 in which the front side protruding electrodes 78 and the vicinities thereof are made of a metal, such a stress cannot be eased, and the vicinity of the low melting point metal layer 83 that is the joint portion and the vicinity of the interface between the UBM layer 77 and the front side protruding electrode 78 or the interconnection member 81 are broken. Thereby, the mechanical junction and electrical connection between two semiconductor chips 91 are broken in some cases.

SUMMARY OF THE INVENTION

An object of the invention is to provide a manufacturing method for a semiconductor chip having high reliability in connection to a wiring board or another semiconductor chip.

Another object of the invention is to provide a semiconductor chip having high reliability in connection to a wiring board or another semiconductor chip.

Still another object of the invention is to provide a semiconductor device including a plurality of semiconductor chips connected to each other with high reliability.

The semiconductor chip manufacturing method according to a first aspect of the invention comprises the steps of: forming a concave portion extending in the thickness direction of the semiconductor substrate that has a front surface and a rear surface and has a function device formed on the front surface, from the front surface; forming an oxidation preventive film made of an inert first metal material by supplying the first metal material onto the inner wall surface of the concave portion; supplying a second metal material containing a metal that is oxidized more easily than the first metal material into the concave portion after the step of forming the oxidation preventive film; electrically connecting the second metal material supplied into the concave portion and the function device; and thinning the semiconductor substrate so that the thickness thereof becomes thinner than the depth of the concave portion by removing the semiconductor substrate from the rear surface while leaving the oxidation preventive film, the concave portion is formed into a through hole penetrating the semiconductor substrate in the thickness direction, and the second metal material disposed in the concave portion is formed into penetrating electrode that electrically connects the front surface side and the rear surface side of the semiconductor substrate and a rear side protruding electrode protruding from the rear surface side of the semiconductor substrate.

According to this invention, after the step of forming the oxidation preventive film, by performing the step of supplying the second metal material, the second metal material covered by the oxidation preventive film is disposed inside the concave portion. This second metal material is formed into a rear side protruding electrode that protrudes to the rear surface side of the semiconductor substrate while being covered by the oxidation preventive film in the thinning step.

According to this manufacturing method, along with thinning of the semiconductor substrate, rear side protruding electrode covered by the oxidation preventive film is formed. In the case where the rear side protruding electrode and the oxidation preventive film are formed separately after the semiconductor substrate is thinned, handling of the thinned semiconductor substrate and alignment when forming the rear side protruding electrode become difficult. This invention does not pose this problem, and can reduce costs since the rear side protruding electrode covered by the oxidation preventive film can be easily formed.

In the obtained semiconductor chip, since the rear side protruding electrode is covered by the oxidation preventive film made of the inert first metal, the rear side protruding electrode is hardly oxidized even when being left in the atmosphere, and the oxidation preventive film itself is not oxidized. Therefore, when this semiconductor chip is joined to a wiring board or another semiconductor chip via the rear side protruding electrode, it is prevented that an oxide film interposes at the junction portion and reduces a substantial junction area. Therefore, the semiconductor chip obtained by this manufacturing method can be joined to a wiring board or another semiconductor chip with high junction strength, and is well connected electrically. Namely, a semiconductor chip having high connection reliability to a wiring board or another semiconductor chip can be manufactured.

A plurality of semiconductor chips obtained by this manufacturing method of the invention are stacked in the thickness direction and connected via the rear side protruding electrodes, whereby these semiconductor chips are joined to each other with high junction strength, whereby a multi-chip semiconductor device realizing excellent electrical connection can be manufactured.

Furthermore, since it is not necessary to use an activator such as a flux to remove an oxide film (or the use amount of the activator can be reduced), there is no (little) possibility that migration due to impure ions caused by the activator occurs and causes an electrical short circuit or nonmetal materials are mixed in the junction interface between the rear side protruding electrode and an electrode pad or the like and lowers the connection reliability.

The step of supplying the second metal material into the concave portion may include a step of supplying the second material to a continuous region from the inside of the concave portion to the function device on the semiconductor substrate. In this case, the step of supplying the second metal material into the concave portion and the step of electrically connecting the second metal material supplied into the concave portion and the function device can be performed at one time.

The above-mentioned first metal material may be made of one or more of gold and palladium. Even when the oxidation preventive film made of gold or palladium is left in the atmosphere, they do not form an oxide film on the exposed surfaces. In this case, the second electrode material may be, for example, copper, tungsten, or aluminum. The step of supplying the second metal material into the concave portion may include the step of supplying the same metal material as the first metal material such as gold or palladium, etc.

Since the resistance of gold is low, by forming the oxidation preventive film inside the through hole, even when the penetrating electrode is made of a metal having high resistance such as tungsten, the resistance between the front surface and the rear surface of the semiconductor substrates via the through holes can be lowered.

This semiconductor chip manufacturing method may further comprise a step of forming an insulating film made of a material having electrical insulation by supplying the material having electrical insulation to the inner wall surface of the concave portion before the step of forming the oxidation preventive film after the step of forming the concave portion.

With this construction, the insulating film can be formed between the semiconductor substrate and the penetrating electrode. By the insulating film, electrical insulation is made between the penetrating electrode and the semiconductor substrate. The insulating film may be made of silicon oxide ($SiO_2$).

In the thinning step, by etching the rear surface of the semiconductor substrate in a condition where the etching rate for the insulating film becomes lower than the etching rate for the semiconductor substrate, the thickness of the semiconductor substrate can be made smaller than the depth of the concave portion while leaving the insulating film and the oxidation preventive film.

In this case, this manufacturing method may further comprise an insulating film removing step of removing the insulating film exposed to the rear surface of the semiconductor substrate so that the oxidation preventive film is exposed, after the thinning step.

This semiconductor chip manufacturing method may further comprise a diffusion preventive film forming step of forming, on the inner wall surface of the concave portion, diffusion preventive film which restrain diffusion of metal atoms from the inside of the through hole to the semiconductor substrate, before the step of forming the oxidation preventive film after the step of forming the concave portion.

With this construction, the diffusion preventive film can be formed between the penetrating electrode and the semiconductor substrate inside the through hole. By the diffusion preventive film, the metals disposed inside the through hole, for example, the metals forming the penetrating electrode and the oxidation preventive film can be prevented from diffusing in the semiconductor substrate and deteriorating the device performance. The diffusion preventive film may be made of, for example, titanium tungsten (TiW), titanium nitride (TiN), or tantalum nitride (TaN).

When inside the through hole, between the semiconductor substrate and the oxidation preventive film, insulating film made of, for example, silicon oxide is formed, and the penetrating electrode is made of copper, copper atoms forming the penetrating electrode cannot be prevented by the insulating film from diffusing into the semiconductor substrate. Even in such a case, the copper atoms inside the through hole can be prevented by the diffusion preventive film made of titanium tungsten or titanium nitride from diffusing into the semiconductor substrate.

After the thinning step, when the diffusion preventive film is exposed while covering the oxidation preventive film on the rear surface side of the semiconductor substrate, it is also possible that the diffusion preventive film is removed to exposed the oxidation preventive film.

This semiconductor chip manufacturing method may further comprise a step of forming, on the inner wall surface of the concave portion, an intermetallic diffusion preventive film for restraining diffusion of metal atoms between the oxidation preventive film and the second metal material before the step of supplying the second metal material into the concave portion after the step of forming the oxidation preventive film.

According to this manufacturing method, a semiconductor chip is obtained which has the intermetallic diffusion preventive film formed between the penetrating electrode and the oxidation preventive film and between the rear side protruding electrode and the oxidation preventive film. In such a semiconductor chip, even when the penetrating electrode and the rear side protruding electrode (second metal material) are made of metal that easily reacts with the metal (first metal material) forming the oxidation preventive film, the metal forming the penetrating electrode and the rear side protruding electrode and the metal forming the oxidation preventive film can be restrained by the intermetallic diffusion preventive film from diffusing.

Thereby, it can be prevented that the metal forming the oxidation preventive film diffuses in the rear side protruding electrode and the oxidation preventive film covering the rear side protruding electrode disappear and cause the surface of the rear side protruding electrode to be oxidized.

Furthermore, in the case where the metal atoms forming the penetrating electrode and the rear side protruding electrode and the metal atoms forming the oxidation preventive film easily diffuse relatively, by providing the intermetallic diffusion preventive film, voids (so-called Kirkendall voids) can be prevented from being created in one of the metal materials due to the difference in the rate of diffusion in to other metal between the metals.

The intermetallic diffusion preventive film may be made of, for example, titanium or titanium tungsten (TiW).

The second metal material may contain a low melting point metal material with a solidus temperature of 60° C. or higher and 370° C. or lower, and in this case, the step of supplying the second metal material into the concave portion may further include a step of forming a low melting point metal layer by supplying the low melting point metal material to the bottoms of the concave portion.

With this construction, a semiconductor chip with low melting point metal layer formed on at least the tip end side of the rear side protruding electrode can be obtained. In the case of such a semiconductor chip, when the rear side protruding electrode is joined to an electrode pad, etc., formed on a wiring board, the low melting point metal can be melted and solidified by heating this semiconductor chip to a temperature equal to or higher than the melting point (solidus temperature) of the low melting point metal (low melting point metal material). Thereby, the rear side protruding electrode and the electrode pad, etc., formed on a wiring board can be excellently joined to each other.

In this case, the metal forming the oxidation preventive film is all taken (diffused) into the low melting point metal layer, and a part of the metal forming the penetrating electrode is also taken into the low melting point metal layer, whereby an alloy layer (a layer including an intermetallic compound and a solid solution or layers made of an eutectic) are formed.

In the low melting point metal layer forming step, it is possible that the low melting point metal material is supplied to only the bottom of the concave portion, and in this case, the step of supplying the second metal material into the concave portion may include a step of supplying a high melting point metal material having a solidus temperature higher than that of the low melting point metal into the concave portion after the low melting point metal layer forming step. Thereby, a semiconductor chip is obtained in which, between the penetrating electrode and the rear side protruding electrode, at least a part of the penetrating electrode is made of the high melting point metal material. Namely, the solidus temperature of the low melting point metal material can be made lower than that of the high melting point metal material that forms at least a part of the penetrating electrode.

The high melting point metal material may be, for example, copper, tungsten, aluminum, or gold.

The low melting point metal material may be made of tin (Sn), an alloy containing tin (for example, tin-silver (Ag)-copper alloy), indium (In), or an alloy containing indium (for example, indium-tin alloy). These low melting point metals are easily oxidized when being exposed in the atmosphere, however, by this manufacturing method, a semiconductor chip in which the low melting point metal layer is covered by the oxidation preventive film is manufactured, so that the low melting point metal layer is prevented from being oxidized. Therefore, metal oxides are prevented from interposing at the junction portion between the rear side protruding electrode and an electrode pad or other protruding electrode, whereby connection reliability can be made high.

The low melting point metal layer forming step may include a paste supplying step for supplying a paste containing powder made of the low melting point metal to the bottom of the concave portion.

In this case, it is preferable that, after the paste supplying step, before the metal material supplying step, a step for removing organic matter in the paste by heating is performed. Thereby, the organic matter amounts in the low melting point metal layer are reduced and the junctions between the rear side protruding electrode and the electrode pad, etc., formed on a wiring board can be prevented from being obstructed by organic matter.

The paste supplying step may include a paste discharge step of discharging a low melting point metal paste from a discharge opening by inserting a dispenser into the concave portion, the dispenser having a needle with the discharge opening for discharging the low melting point metal paste on its tip end.

Thereby, the low melting point metal paste can be supplied to only the bottom of the concave portion, so that a semiconductor chip is obtained in which the low melting point metal layer is formed only at the tip ends of the rear side protruding electrode as the junction portions to an electrode pad, etc., formed on a wiring board.

The paste discharge step may include a step of discharging the low melting point metal paste from the discharge opening by making the discharge opening of the dispenser proximal to the bottom of the concave portion, and may include a jet-dispensing step for supplying the low melting point metal paste to the bottom of the concave portion by jetting a slight amount of the low melting point metal paste from the discharge opening.

A semiconductor chip manufacturing method according to a second aspect of the invention comprises the steps of: forming a hole opened to one surface of a semiconductor substrate on which a function device is formed; embedding a polymer inside the hole; forming an interconnection layer electrically connected to the function device on an exposed surface of the polymer embedded inside the hole; and forming a protruding electrode on the interconnection layer on the polymer.

According to this invention, a semiconductor chip having the protruding electrode formed on the polymer disposed inside the hole can be manufactured. In comparison with a metal material, the polymer is easily deformed. Therefore, in such a semiconductor chip, even when a stress is applied to the semiconductor chip while the semiconductor chip is joined to an electrode pad formed on a wiring board or another semiconductor chip, etc., via the protruding electrode, such a stress can be eased by the polymer. Therefore, the junction portion between the protruding electrode and electrode pad or the protruding electrode of another semiconductor chip is hardly broken. Namely, according to this manufacturing method, a semiconductor chip with high connection reliability can be manufactured.

It is preferable that the polymer is embedded so as to almost completely fill the inside of the concave portion, and also, it is preferable that the exposed surface of the polymer embedded inside the concave portion is flush with the front surface of the semiconductor substrate. In this case, the interconnection layer is formed on the exposed surface of the polymer flush with the front surface of the semiconductor substrate.

The holes in which the polymer is supplied may be concave portion or through hole penetrating the semiconductor substrate in the thickness direction.

As the polymer, for example, polyimide, epoxy, phenolic resin, silicone, acryl-based resin or the like can be used. Particularly, polyimide can be preferably used as a material having a high stress easing effect and high tenacity.

The interconnection layer forming step may include a step of forming the interconnection layer so that the polymer is exposed from the portion between the hole edge portions and the interconnection layer.

With this construction, a semiconductor chip can be manufactured in which a part of the hole edge portion is not joined to the interconnection layer on the polymer. In such a semiconductor chip, the interconnection layer and the protruding electrode on the polymer easily freely move, so that a stress is effectively eased. As the exposed area of the polymer between the hole edge portion and the interconnection layer increases, the interconnection layer and the protruding electrode on the polymer more easily freely move, and the above-mentioned stress easing effect increases.

The step of forming the hole may include a step of forming a concave portion as the hole, and in this case, the function device may be formed on the one surface of the semiconductor substrate, and in this case, it may further include, after the step of forming the concave portion, before the step of embedding the polymer into the concave portion, a step of forming a conductive film electrically connected to the function device by supplying a conductive material to the inner wall surface of the concave portion, and after the step of supplying the polymer into the concave portion, a thinning step of thinning the semiconductor substrate so that the thickness thereof is reduced to be thinner than the depth of the concave portion by removing the semiconductor substrate from the other surface different from the one surface, the concave portion is formed into through hole penetrating the semiconductor substrate in the thickness direction, and the conductive film is disposed across the one surface side and the other surface side of the semiconductor substrate.

With this construction, a semiconductor chip can be manufactured in which one surface side (with the function devices) of the semiconductor substrate is electrically connected to the other surface side with a short interconnection length by the conductive film.

The thinning step may include a step of thinning the semiconductor substrate to be thinner than the depth of the concave portion while leaving the conductive film. In this case, a polymer that protrudes from the other surface of the semiconductor substrate and covered by the conductive film can be formed. The semiconductor chip obtained by this manufacturing method can be joined to an electrode pad formed on a wiring board or the protruding electrode of another semiconductor chip by using the polymer that protrudes from the other surface of the semiconductor chip and is covered by the conductive film as a rear side protruding electrode.

In this case, it is preferable that the conductive film (a penetrating electrode) is made of an inert metal material (such as gold, palladium, or an alloy of these), and in this case, the conductive film formed on the surface of the rear side protruding electrode is hardly oxidized, so that it can be excellently joined to an electrode pad formed on a wiring board or a protruding electrode of another semiconductor chip.

A semiconductor chip according to a third aspect of the invention comprises: a semiconductor substrate having a front surface and a rear surface; a function device formed on the front surface of the semiconductor substrate; a penetrating electrode which is electrically connected to the function device, disposed inside a through hole penetrating the semiconductor substrate in the thickness direction by the side of the function device, and electrically connect the front surface side and the rear surface side of the semiconductor substrate; a rear side protruding electrode that protrudes from the rear surface of the semiconductor substrate and has a side surface continued to the side surface of the penetrating electrode; and an oxidation preventive film which covers the rear side protruding electrode and is disposed between the semiconductor substrate and the penetrating electrode inside the through hole and made of an inert metal material.

The oxidation preventive film may be made of one or more metals of gold and palladium.

This semiconductor chip may further comprise an insulating film disposed between the oxidation preventive film and the semiconductor substrate inside the through hole.

This semiconductor chip may further comprise a diffusion preventive film which is disposed between the oxidation preventive film and the semiconductor substrate inside the through hole and restrain diffusion of metal atoms from the inside of the through hole to the semiconductor substrate.

This semiconductor chip may further comprise an intermetallic diffusion preventive film which is disposed between the oxidation preventive film and the penetrating electrode inside the through hole and restrain diffusion of metal atoms between the oxidation preventive film and the penetrating electrode.

At least the tip end side of the rear side protruding electrode may be made of low melting point metal layer whose solidus temperature is in a temperature range of 60° C. or higher and 370° C. or lower.

A semiconductor chip according to a fourth aspect of the invention comprises a semiconductor substrate with a function device formed thereon, a polymer disposed so as to fill the inside of a hole opened to one surface of the semiconductor substrate, an interconnection layer which is formed on the polymer embedded inside the hole and electrically connected to the function device, and a protruding electrode provided on a portion positioned on the polymer of the interconnection layer.

The polymer may be exposed between the edge portion of the concave portion and the interconnection layer.

A semiconductor chip according to a fifth aspect of the invention comprises: a semiconductor substrate with a function device formed thereon; a polymer disposed inside a through hole penetrating the semiconductor substrate in the thickness direction; an interconnection layer which is formed on the polymer disposed inside the through hole and electrically connected to the function device; a protruding electrode provided on a portion positioned on the polymer of the interconnection layer; and a conductive film which is disposed across one surface and the other surface of the semiconductor substrate inside the through hole and electrically connected to the function device.

A semiconductor device according to a sixth aspect of the invention comprises a plurality of semiconductor chips stacked in the thickness direction. Each semiconductor chip comprises: a semiconductor substrate having a front surface and a rear surface; a function device formed on the front surface of the semiconductor substrate; a penetrating electrode which is electrically connected to the function device, disposed inside a through hole penetrating the semiconductor substrate in the thickness direction by the side of the function device, the penetrating electrode electrically connecting the front surface side and the rear surface side of the semiconductor substrate; a rear side protruding electrode which protrudes from the rear surface of the semiconductor substrate and has a side surface continued to the side surface of the penetrating electrode; and an oxidation preventive film which covers the rear side protruding electrode, and is disposed between the semiconductor substrate and the penetrating electrode inside the through hole and made of an inert metal material.

A semiconductor device according to a seventh aspect of the invention comprises a plurality of semiconductor chips stacked in the thickness direction. Each semiconductor chip comprises: a semiconductor substrate with a function device formed thereon; a polymer disposed so as to fill the inside of a hole opened to one surface of the semiconductor substrate; an interconnection layer which is formed on the polymer embedded inside the hole and electrically connected to the function device; and a protruding electrode provided on a portion positioned on the polymer of the interconnection layer.

A semiconductor device according to an eighth aspect of the invention comprises a plurality of semiconductor chips stacked in the thickness direction. Each semiconductor chip comprises: a semiconductor substrate with a function device formed thereon; a polymer disposed inside a through hole penetrating the semiconductor substrate in the thickness direction; an interconnection layer which is formed on the polymer disposed inside the through hole and electrically connected to the function device; a protruding electrode provided on a portion positioned on the polymer of the interconnection layer; and a conductive film which is disposed a cross one surface and the other surface of the semiconductor substrate inside the through hole and is electrically connected to the function device.

These semiconductor devices are so-called multi-chip semiconductor devices, wherein the protruding electrodes (rear side protruding electrodes) of one of two adjacent semiconductor chips are joined and electrically connected to the other semiconductor chip. Thereby, the two adjacent semiconductor chips have high junction strength and excellent electrical connectivity.

A plurality of semiconductor chips may be stacked on a wiring board (interposer) or a lead frame and connected. The plurality of semiconductor chips may be connected by being stacked on a wiring board or a lead frame via a solid state device such as other semiconductor chip. In these cases, the surface of each semiconductor chip on which a function device (active layer) has been formed may be turned toward the wiring board or lead frame side, or may be turned toward the opposite side of the wiring board or lead frame. The solid state device or semiconductor chip and the wiring board or the lead frame may be electrically connected by, for example, a bonding wire.

The semiconductor device according to the invention may have the form of the so-called BGA (Ball Grid Array) or the form of QFN (Quad Flat Non-lead), or may have another arbitrary package form.

The above-mentioned or other objects, features, and effects of the invention are clarified by the description of embodiments given below by referring to the accompanying drawings.

BRIEF DESCRIPTION OF THE DRAWINGS

FIG. 9($b$) is an illustrative plan view showing the structure of a semiconductor chip relating to a modification of the semiconductor chip shown in FIG. 7.

FIG. 10($a$) is an illustrative sectional view showing the structure of a semiconductor chip relating to another modification of the semiconductor chip shown in FIG. 7.

FIG. 10($b$) is an illustrative plan view showing the structure of a semiconductor chip relating to another modification of the semiconductor chip shown in FIG. 7.

FIG. 11($a$) is an illustrative sectional view showing the structure of a semiconductor chip relating to still another modification of the semiconductor chip shown in FIG. 7.

FIG. 11($b$) and FIG. 11($c$) are illustrative plan views showing the structure of a semiconductor chip relating to still another modification of the semiconductor chip shown in FIG. 7.

FIG. 18 is an illustrative sectional view showing the structure of a fourth semiconductor device including a plurality of semiconductor chips shown in FIG. 1.

FIG. 19 is an illustrative sectional view showing the structure of a fifth semiconductor device including a plurality of semiconductor chips shown in FIG. 1.

DESCRIPTION OF THE PREFERRED EMBODIMENTS

Hereinafter, embodiments of the invention are described in detail with reference to the accompanying drawings.

Figure 1:
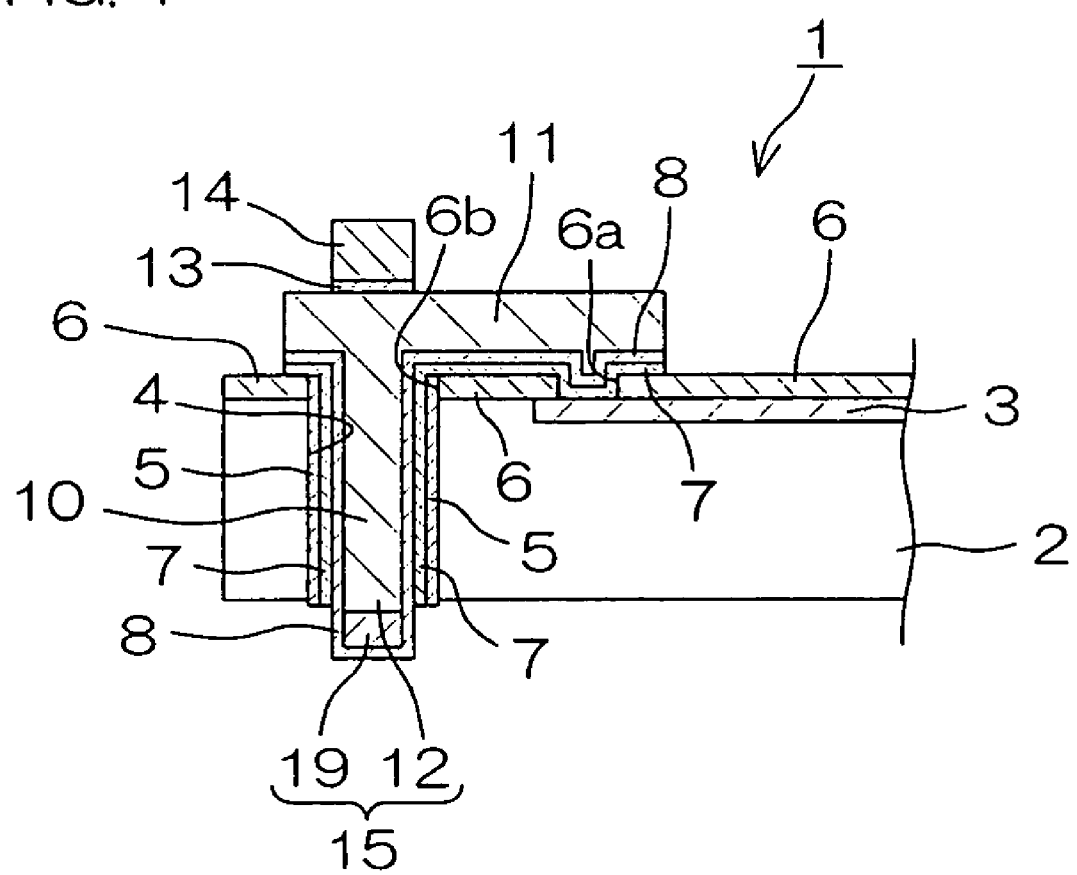
FIG. 1 is an illustrative sectional view showing the structure of a semiconductor chip relating to a first embodiment of the invention.

FIG. 1 is an illustrative sectional view showing the structure of a semiconductor chip relating to a first embodiment of the invention.

This semiconductor chip 1 includes a semiconductor substrate 2 made of silicon (Si). On one surface (hereinafter, referred to as "front surface") of the semiconductor substrate 2, a function device 3 having a plurality of electrodes is formed. By the side of the function device 3, a through hole 4 penetrating the semiconductor substrate 2 in the thickness direction is formed.

On the front surface of the semiconductor substrate 2, a hard mask 6 having openings 6a and 6b is formed. The hard mask 6 is made of silicon oxide ($SiO_2$). In a vertical top plan view of the semiconductor substrate 2, the electrode of the function device 3 exists inside the opening 6a. The opening 6b and the through hole 4 forms one hole having a continuous inner wall surface.

On the inner wall surface of the through hole 4 and the opening 6b, an insulating film 5 made of silicon oxide is formed. In a predetermined region including the surface of the insulating film 5, the surface of the electrode of the function device 3 exposed inside the opening 6a, and the surface of the hard mask 6 between the opening 6b and the opening 6a, a continuous diffusion preventive film 7 made of titanium tungsten (TiW), tantalum nitride (TaN) or titanium nitride (TiN) is formed.

On the diffusion preventive film 7, an oxidation preventive film 8 made of gold (Au), palladium (Pd), or an alloy of gold and palladium is formed.

The insides of the through hole 4 and the opening 6b are filled with a penetrating electrode 10. On the front surface of the semiconductor substrate 2, on the penetrating electrode 10 and on the diffusion preventive film 7 except for the through hole 4 and the opening 6b, an interconnection member 11 integral with the penetrating electrode 10 is provided. The penetrating electrode 10 and the interconnection member 11 are made of copper (Cu), tungsten (W), gold, or aluminum (Al), or an alloy of these.

The electrode of the function device 3 exposed to the opening 6b is electrically connected to the penetrating electrode 10 via the diffusion preventive film 7, the oxidation preventive film 8, and the interconnection member 11.

On the interconnection member 11, a front side protruding electrode (bump) 14 made of gold or copper is formed via a UBM (Under Bump Metal) layer 13 made of titanium tungsten (TiW) or titanium. The front side protruding electrode 14 and the UBM layer 13 are disposed almost right above the penetrating electrode 10 (so as to roughly overlap the penetrating electrode 10 in the vertical top plan view of the semiconductor substrate 2).

On the surface opposite the front surface (hereinafter, referred to as "rear surface") of the semiconductor substrate 2, a rear side protruding electrode 15 that is connected to the penetrating electrode 10 and protrudes from the rear surface is formed. The rear side protruding electrode 15 is formed so as to roughly overlap the penetrating electrode 10 and the front side protruding electrode 14 in the vertical top plan view of the semiconductor substrate 2. The rear side protruding electrode 15 has a side surface continued to the side surface of the penetrating electrode 10.

The tip end side of the rear side protruding electrode 15 is formed into a low melting point metal layer 19 made of an aggregate of a low melting point metal powder, and the remainder 12 of the rear side protruding electrode 15 is made of copper and integrated with the penetrating electrode 10. Most of the rear side protruding electrode 15 is comprised of the low melting point metal layer 19. The low melting point metal powder is made of, for example, tin (Sn), an alloy containing tin (for example, tin-silver (Ag)-copper alloy), indium (In), and an alloy containing indium (for example, indium-tin alloy).

The rear side protruding electrode 15 is covered by the oxidation preventive film 8 continued from the inside of the through hole 4, and is not exposed.

With the above-mentioned construction, to the function device 3, electrical connection can be made from the front surface side of the semiconductor chip 1 via the front side protruding electrode 14, and electrical connection from the rear surface side of the semiconductor chip 1 via the rear side protruding electrode 15 is also possible.

Concretely, this semiconductor chip 1 can be joined to electrode pads, etc., formed on a wiring substrate via the rear side protruding electrodes 15. In addition, by layering the semiconductor chips 1 in the vertical direction and joining the front side protruding electrode 14 and the rear side protruding electrode 15 of adjacent semiconductor chips 1, the semiconductor chips 1 can be mechanically joined and electrically connected to each other. By the penetrating electrode 10 penetrating the semiconductor substrate 2, the interconnection length between the front surface side and the rear surface side of the semiconductor substrate 2 can be shortened.

When the rear side protruding electrode 15 is joined to an electrode pad, etc., formed on a wiring board or the front side protruding electrode 14 of another semiconductor chip, by heating the low melting point metal layer 19 to a temperature equal to or higher than the melting point (solidus temperature) of the metal forming the low melting point metal layer 19 for an appropriate period of time, it becomes possible to melt and solidify the low melting point metal layer 19. Thereby, the rear side protruding electrode 15 and an electrode pad or the front side protruding electrode 14 of another semiconductor chip 1 are joined.

At this point, the oxidation preventive film 8 covering the rear side protruding electrode 15 is taken into the rear side protruding electrode 15 to form an alloy layer (layer containing an intermetallic compound or a solid solution, or layer made of a eutectic). For example, when the oxidation preventive film 8 is made of gold and the low melting point metal layer 19 is made of tin, an alloy layer containing tin and an intermetallic compound of gold and tin is formed. Furthermore, when the penetrating electrode 10 is made of copper or gold, a part of the copper and gold is also taken into the low melting point metal layer 19 to form an alloy with the low melting point metal.

The rear side protruding electrode 15 of this semiconductor chip 1 is covered by the oxidation preventive film 8, so that even when it is left in the atmosphere, no oxide film is formed on the surface of the rear side protruding electrode 15. In addition, the oxidation preventive film 8 itself made of gold or palladium is not oxidized. Accordingly, when the rear side protruding electrode 15 and an electrode pad or the front side protruding electrode 14 of another semiconductor chip 1 are joined to each other, no oxide interposes between these. Therefore, this semiconductor chip 1 can be joined to a wiring board or another semiconductor chip by increasing its junction strength, and can increase electrical connection reliability.

Furthermore, there is no need to use an activator such as flux for removing an oxide film (or the use amount of the activator can be reduced), so that there is no (little) possibility that migration due to impure ions derived from the activator occurs and causes an electrical short circuit, or connection reliability is lowered due to mixing of nonmetal substances to the junction interface between the rear side protruding electrode 15 and the electrode pad, etc.

By layering a plurality of such semiconductor chips 1 in the thickness direction and joining these via the rear side protruding electrode 15, a multi-chip semiconductor device can be manufactured in which these semiconductor chips 1 are joined to each other with high junction strength and are well connected electrically.

Furthermore, when the penetrating electrode 10 and the interconnection member 11 are made of tungsten and the oxidation preventive film 8 is made of gold, the function device 3 and the rear side protruding electrode 15 are electrically connected by the oxidation preventive film 8 made of gold the electrical resistance (specific resistance) of which is lower than that of tungsten in addition to penetrating the electrode 10 and the interconnection member 11 (tungsten). In this case, in comparison with the case where no oxidation preventive film 8 is provided, electrical resistance between the function device 3 and the rear side protruding electrode 15 can be lowered.

By providing the insulating film 5 between the semiconductor substrate 2 and the penetrating electrode 10, the oxidation preventive film 8, and the diffusion preventive film 7 inside the through hole 4, and by providing the hard mask 6 between the semiconductor substrate 2 and the interconnection member 11, the oxidation preventive film 8, and the diffusion preventive film 7 on the front surface side of the semiconductor substrate 2, the conduction path from the electrode of the function device 3 to the rear side protruding electrode 15 is electrically insulated from the semiconductor substrate 2.

By providing the diffusion preventive film 7 between the semiconductor substrate 2 (insulating film 5 and hard mask 6) and the penetrating electrode 10, the interconnection member 11, and the oxidation preventive film 8, metal atoms forming the penetrating electrode 10, the interconnection member 11, and the oxidation preventive film 8 are prevented (restrained) from diffusing into the semiconductor substrate 2 at the time of manufacturing or after manufacturing the semiconductor chip 1. Thereby, the semiconductor chip 1 can be prevented from deteriorating in device performance.

Figure 2:
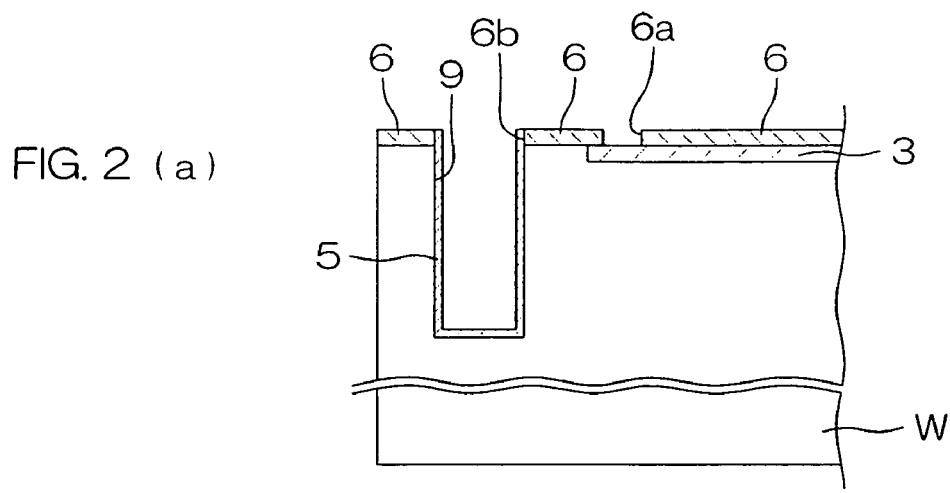
FIG. 2($a$) through FIG. 2($j$) are illustrative sectional views for explaining a manufacturing method for the semiconductor chip shown in FIG. 1.
Figure 2:
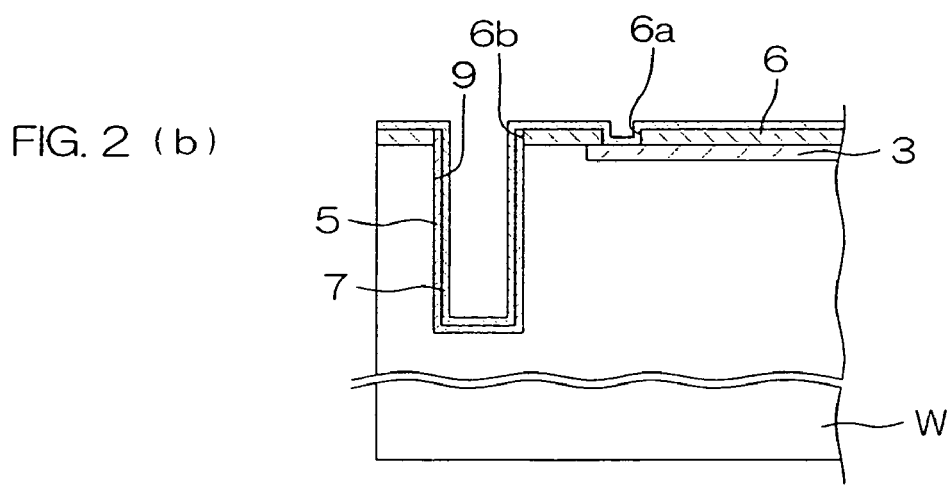
Figure 2:
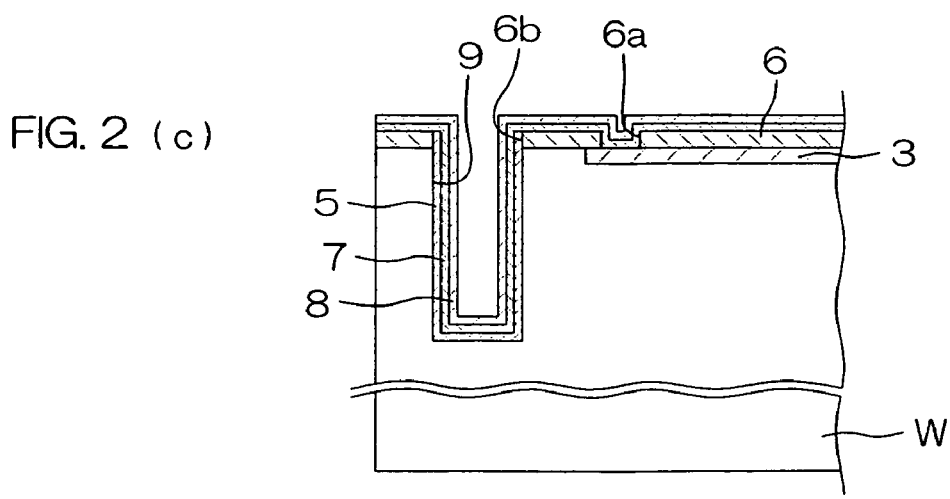
Figure 2:
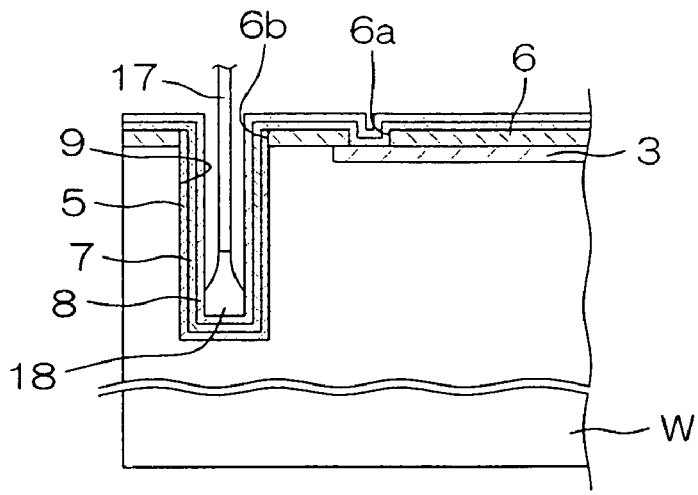
Figure 2:
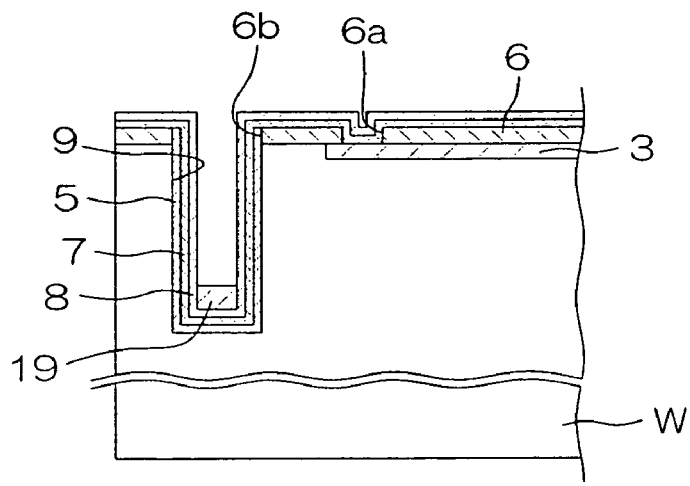
Figure 2:
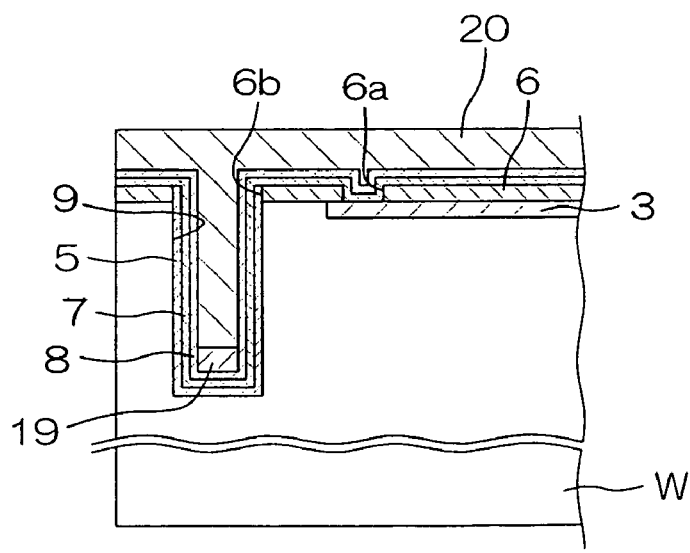
Figure 2:
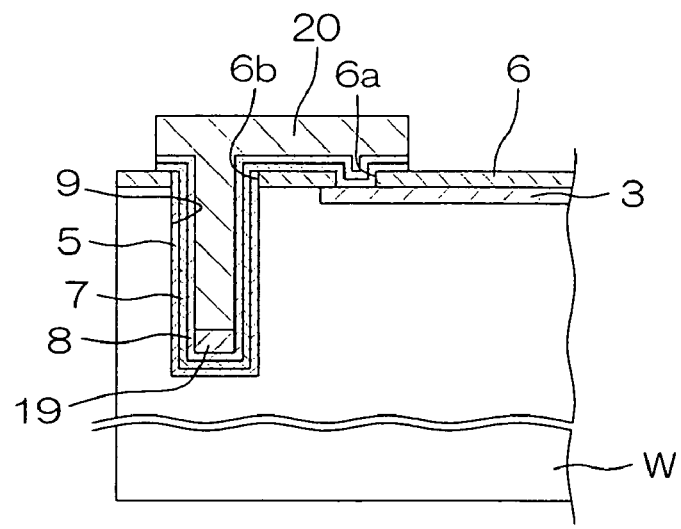
Figure 2:
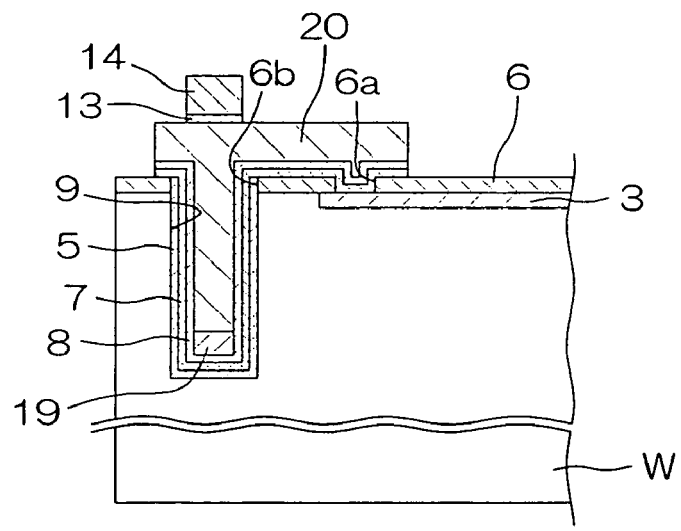
Figure 2:
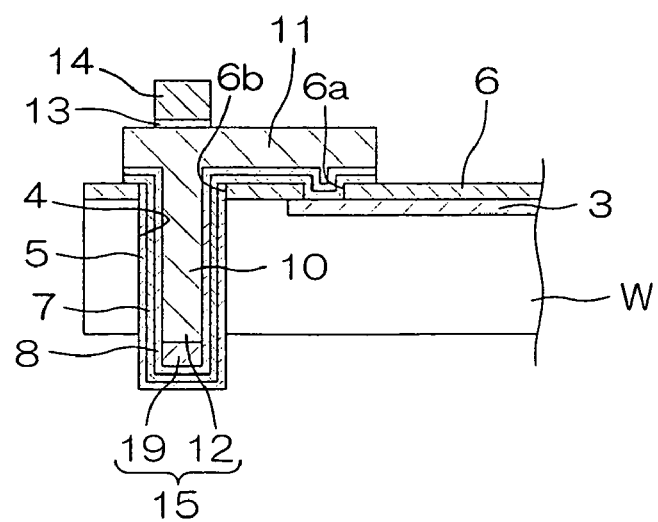
Figure 2:
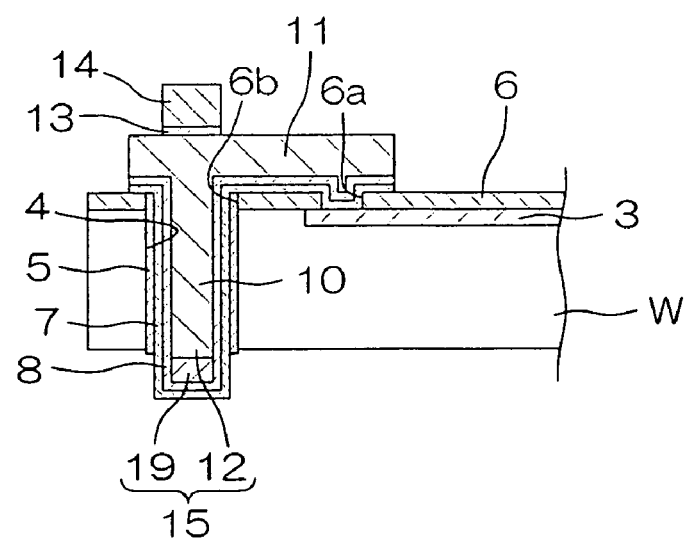

FIG. 2(*a*) through FIG. 2(*j*) are illustrative sectional views for explaining a manufacturing method for the semiconductor chip 1 shown in FIG. 1. A plurality of semiconductor chips 1 are formed from one semiconductor wafer (hereinafter, referred to as "wafer," simply) W, however, in FIG. 2(*a*) through FIG. 2(*j*), only a portion corresponding to apart of one semiconductor chip 1 of the wafer W is shown. Within the wafer W shown in FIG. 2(*a*) through FIG. 2(*j*), a plurality of regions corresponding to semiconductor chips 1 with the final form shown in FIG. 1 are closely arranged in the in-plane direction of the wafer W.

A hard mask 6 having openings 6a and 6b at predetermined portions is formed on a front surface of the wafer W that has a function device 3 formed on the front surface. Inside the opening 6a, the electrode of the function device 3 is exposed. Furthermore, inside the opening 6b, a predetermined region of the wafer W where the function device 3 is not formed is exposed.

Next, by reactive ion etching (RIE), the wafer W exposed inside the opening 6b is etched to form a concave portion 9. During this, the opening 6a is closed by a resist so that the function device 3 is not etched. Next, by the CVD (Chemical Vapor Deposition) method, silicon oxide is supplied to the inner surface of the concave portion 9 to form an insulating film 5. This condition is shown in FIG. 2(*a*). Subsequently, tantalum or titanium and nitrogen are supplied to the entire exposed surface of the wafer W front surface side including the insides of the openings 6a and 6b and the inside of the concave portion 9 to form a diffusion preventive film 7 (see FIG. 2(*b*)).

Then, on this diffusion preventive film 7, that is, onto the entire exposed surface of the wafer W front surface side including the inside of the concave portion 9, gold or palladium is supplied by sputtering, CVD, or electroless plating to form an oxidation preventive film 8. This condition is shown in FIG. 2(*c*).

Next, a low melting point metal paste 18 containing a low melting point metal powder and organic matter is supplied with a dispenser to the bottom of the concave portion 9. The dispenser has a needle 17 having a discharge opening for the low melting point metal paste 18 formed on its tip end, and in a condition where the tip end of the needle 17 is inserted to the inside of the concave portion 9 to make the discharge opening proximal to the bottom of the concave portion 9, the low melting point metal paste 18 is discharged from the discharge opening (see FIG. 2(*d*)).

This step may be performed by using jet dispensing in which a slight amount of the low melting point metal paste 18 is jetted and supplied to a predetermined region (the bottom of the concave portion 9).

Subsequently, the wafer W is heated to an appropriate temperature, and organic matter contained in the low melting point metal paste 18 is removed. Thereby, as shown in FIG. 2(*e*), the low melting point metal layer 19 that is an aggregate of the low melting point metal powder is disposed only at the bottom of the concave portion 9.

Next, a seed layer (not shown) made of the same kind of metal material as that of the penetrating electrode 10 and the interconnection member 11 is formed on the entire exposed surface of the wafer W front surface side including the inside of the concave portion 9. Then, by electrolytic plating by using this seed layer as a seed, a metal material (one or more kinds of copper, tungsten, gold, and aluminum) 20 for forming the interconnection member 11, the penetrating electrode 10, and the remainder 12 of the rear side protruding electrode 15 is supplied.

Thereby, the insides of the openings 6a and 6b and the concave portion 9 are completely filled up with the metal material 20. The metal material 20 is electrically connected to the electrode of the function device 3 exposed to the opening 6a of the hard mask 6 via the diffusion preventive film 7 and the oxidation preventive film 8. The metal material 20 is also supplied onto the oxidation preventive film 8 (seed layer) outside the concave portion 9, and is continuously disposed from the inside of the opening 6a to the inside of the opening 6b and the inside of the concave portion 9. This condition is shown in FIG. 2(f).

The step of supplying the metal material 20 may be performed by electroless plating, sputtering, or CVD, and in this case, it is not necessary to perform the step of forming the seed layer.

Next, by using a predetermined pattern mask, portions of the metal material 20 (including the seed layer when it is formed by electrolytic plating), the oxidation preventive film 8, and the diffusion preventive film 7 except for a predetermined region including the concave portion 9 (opening 6b) and the opening 6a in the vertical top plan view of the wafer W are removed by etching. This condition is shown in FIG. 2(g).

Thereafter, a surface protective film (not shown) made of silicon oxide or silicon nitride ($Si_3N_4$) for protecting the metal material 20 is formed so as to cover the metal material 20 as appropriate.

Subsequently, on the metal material 20, a UBM layer 13 and a front side protruding electrode 14 are formed in order. The UBM layer 13 and the front side protruding electrode 14 are formed in a region that roughly overlaps the concave portion 9 in the vertical top plan view of the wafer W (see FIG. 2(h)). Furthermore, when the surface protective film is formed on the metal material 20, prior to forming the UBM layer 13, a condition where no surface protective film exists in the region for forming the front side protruding electrode 14 is made.

Next, the rear surface of the wafer W is dry-etched so as to have a thickness smaller than the depth of the concave portion 9 (the depth where the interface between the metal material 20 and the low melting point metal layer 19 exists) This step is performed by setting the etching rate of the insulating film 5 to be lower than the etching rate of the wafer W. Thereby, the concave portion 9 is formed into a through hole 4 penetrating the wafer W in the thickness direction, and the metal material 20 disposed inside the concave portion 9 is formed into a penetrating electrode 10 that electrically connects the front surface side and the rear surface side of the wafer W.

The low melting point metal layer 19 and a part of the metal material 20 disposed inside the concave portion 9 form a rear side protruding electrode 15 protruding from the rear surface of the wafer W while being covered by the insulating film 5 and the diffusion preventive film 7. The remainder of the metal material 20 becomes an interconnection member 11 which electrically connects the penetrating electrode 10 and the electrode of the function device 3. This condition is shown in FIG. 2(i).

Next, the insulating film 5 exposed to the rear surface of the wafer W is removed by etching. Thereby, as shown in FIG. 2(j), the diffusion preventive film 7 covering the rear side protruding electrode 15 is exposed. Furthermore, the diffusion preventive film 7 covering the rear side protruding electrode 15 is removed by etching and the oxidation preventive film 8 covering the rear side protruding electrode 15 is exposed.

Thereafter, the wafer W is cut into pieces of semiconductor chips 1 having penetrating electrodes 10 shown in FIG. 1.

According to this manufacturing method, along with thinning of the wafer W, the rear side protruding electrode 15 covered by the oxidation preventive film 8 is formed. When the rear side protruding electrode 15 and the oxidation preventive film 8 are formed separately after thinning the wafer W, handling of the thinned wafer W and alignment in forming of the rear side protruding electrode 15 become difficult. According to this manufacturing method, this problem does not occur, and the rear side protruding electrode 15 covered by the oxidation preventive film 8 can be formed easily, so that costs can be reduced.

Figure 3:
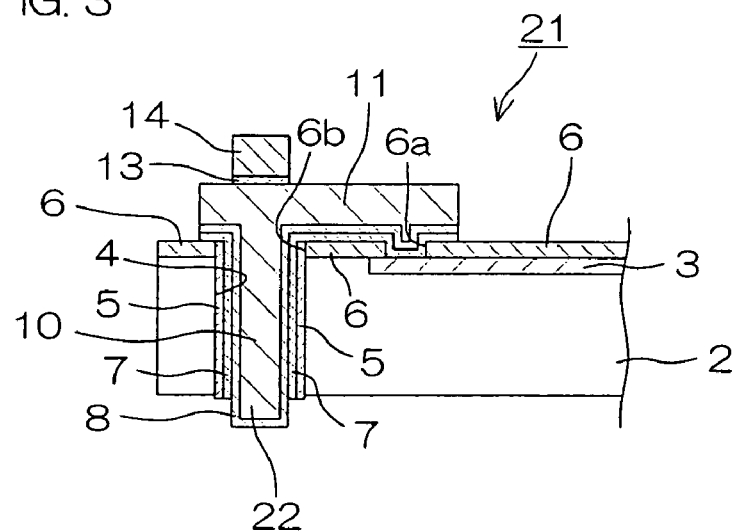
FIG. 3 is an illustrative sectional view for explaining the structure of a semiconductor chip relating to a second embodiment of the invention.

FIG. 3 is an illustrative sectional view of a semiconductor chip relating to a second embodiment of the invention. In FIG. 3, portions corresponding to the parts of the semiconductor chip 1 shown in FIG. 1 are attached with the same reference symbols as in FIG. 1 and description thereof is omitted.

This semiconductor chip 21 has a structure similar to that of the semiconductor chip 1, however, the rear side protruding electrode 22 does not include the low melting point metal layer 19 (see FIG. 1), and the entirety of the rear side protruding electrode 22 is made of the same kind of material as that of the penetrating electrode 10 (copper, tungsten, aluminum, or an alloy of these). The penetrating electrode 10 and the rear side protruding electrode 22 are formed integrally. The rear side protruding electrode 22 is covered by the oxidation preventive film 8 like the rear side protruding electrode 15 of the semiconductor chip 1.

By joining the rear side protruding electrode 22 to an electrode pad formed on a wiring board or the front side protruding electrode 14 of another semiconductor chip 1 or 21, the semiconductor chip 21 can be connected to the wiring board or the semiconductor chip 1 or 21. In this case, the semiconductor chip 21 and the wiring board or another semiconductor chip 1 or 21 are heated to an appropriate temperature, the rear side protruding electrode 22 is pressed against the electrode pad or the front side protruding electrode 14 of another semiconductor chip 1 or 21 with a proper pressure, and as appropriate, an ultrasonic wave is applied to the contact portion between these. Thereby, the rear side protruding electrode 22 and the electrode pad or the front side protruding electrode 14 of another semiconductor chip 1 or 21 can be joined to each other by a temperature lower than the melting point (solidus temperature) of the rear side protruding electrode 22.

Even when this semiconductor chip 21 is left in the atmosphere, the surface of the rear side protruding electrode 22 is prevented by the oxidation preventive film 8 from being oxidized. Therefore, no metal oxide is interposed at the junction interface between the rear side protruding electrode 22 and the electrode pad or the front side protruding electrode 14 of another semiconductor chip 1 or 21, whereby high junction strength can be obtained.

Figure 4:
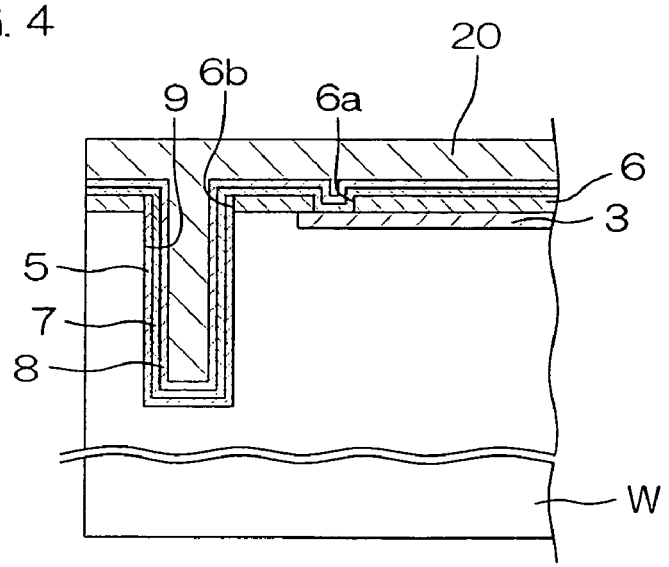
FIG. 4 is an illustrative sectional view for explaining a manufacturing method for the semiconductor chip shown in FIG. 3.

FIG. 4 is an illustrative sectional view for explaining a manufacturing method for the semiconductor chip 21 shown in FIG. 3.

The steps up to the step of forming the oxidation preventive film 8 (see FIG. 2(c)) are performed in the same manner as in the manufacturing method for the semiconductor chip 1. Thereafter, the step of supplying the low melting point metal paste 18 (see FIG. 2(d)) is not performed, and the step of supplying the metal material 20 (including the step of forming a seed layer when the metal material 20 is supplied by electrolytic plating) is performed in the same manner as in the manufacturing method for the semiconductor chip 1 (see FIG. 2(f)). Thereby, as shown in FIG. 4, the inside of the concave portion 9 including the bottom thereof is filled up with the metal material 20.

Thereafter, the step of removing portions of the metal material 20 (including the seed layer when the metal material 20 is formed by electrolytic plating), the oxidation preventive film 8, and the diffusion preventive film 7 except for a predetermined region (see FIG. 2(g)), and subsequent steps are performed in the same manner as in the manufacturing method for the semiconductor chip 1, whereby the semiconductor chip 21 shown in FIG. 3 is obtained.

Figure 5:
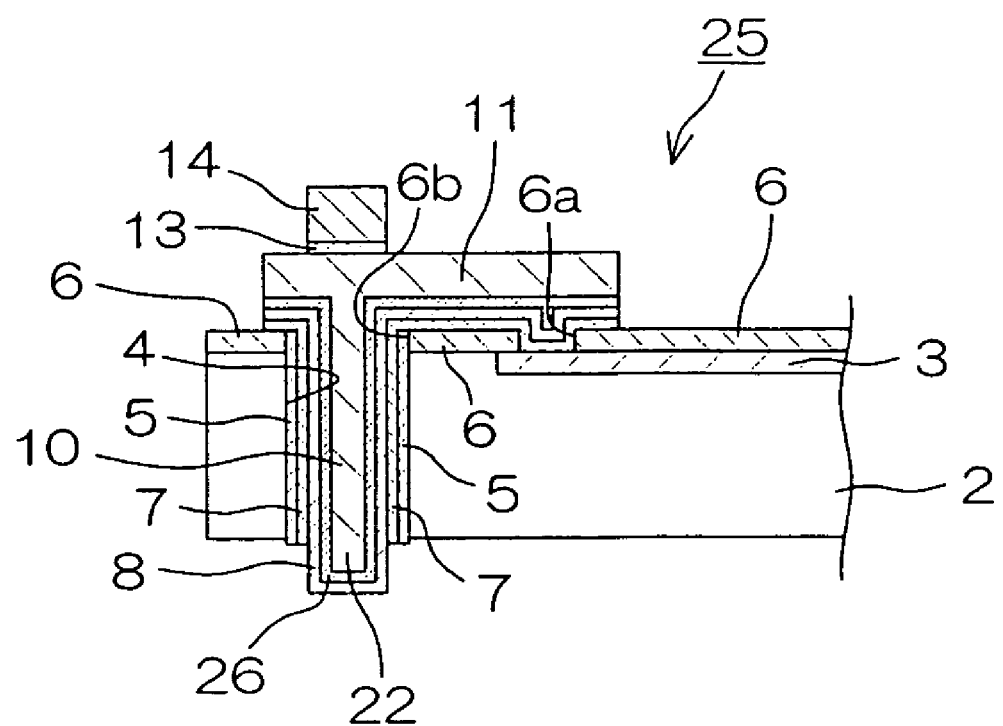
FIG. 5 is an illustrative sectional view showing the structure of a semiconductor chip relating to a third embodiment of the invention.

FIG. 5 is an illustrative sectional view showing the structure of a semiconductor chip relating to a third embodiment of the invention. In FIG. 5, portions corresponding to the parts of the semiconductor chip 21 shown in FIG. 3 are attached with the same reference symbols as in FIG. 3 and description thereof is omitted.

This semiconductor chip 25 has a structure similar to that of the semiconductor chip 21 shown in FIG. 3, however, between the oxidation preventive film 8 and the penetrating electrode 10 and between the oxidation preventive film 8 and the interconnection member 11, an intermetallic diffusion preventive film 26 is interposed. The intermetallic diffusion preventive film 26 is made of titanium tungsten or titanium.

When the metal forming the oxidation preventive film 8 and the metal forming the penetrating electrode 10 and the interconnection member 11 easily react with each other, for example, when the oxidation preventive film 8 is made of gold, and the penetrating electrode 10 and the interconnection member 11 are made of copper, reaction between these can be prevented by the intermetallic diffusion preventive film 26. Thereby, metal atoms forming the oxidation preventive film 8 covering the rear side protruding electrode 22 can be prevented from diffusing into the rear side protruding electrode 22 and causing the oxidation preventive film 8 to disappear, and the surface of the rear side protruding electrode 22 can be prevented from being oxidized.

Furthermore, when metal atoms forming the penetrating electrode 10, the rear side protruding electrode 22, and the interconnection member 11 and metal atoms forming the oxidation preventive film 8 relatively diffuse easily (for example, when the penetrating electrode 10 and so on are made of copper and the oxidation preventive film 8 is made of gold), by providing the intermetallic diffusion preventive film 26, it can be prevented that voids (so-called Kirkendall voids) are created in one of the metal materials due to the difference in rate of diffusion into the other metal between the metals. Thereby, the mechanical junction strength and electrical connection reliability between the penetrating electrode 10, the rear side protruding electrode 22, and the interconnection member 11 and the oxidation preventive film 8 can be prevented from deteriorating.

Furthermore, by interposing the intermetallic diffusion preventive film 26 between the function device 3 and the interconnection member 11, metal atoms forming the interconnection member 11 can be prevented from diffusing into the function device 3 and deteriorating the performance of the function device 3.

On the other hand, when the oxidation preventive film 8 is made of gold and the penetrating electrode 10 and so on are made of nickel (Ni), or when the penetrating electrode 10 and so on are made of tungsten regardless of the kind of oxidation preventive film 8, the metal forming the oxidation preventive film 8 and the metal forming the penetrating electrode 10 and so on hardly react with each other. In such a case, it is not necessary to provide the intermetallic diffusion preventive film 26.

Figure 6:
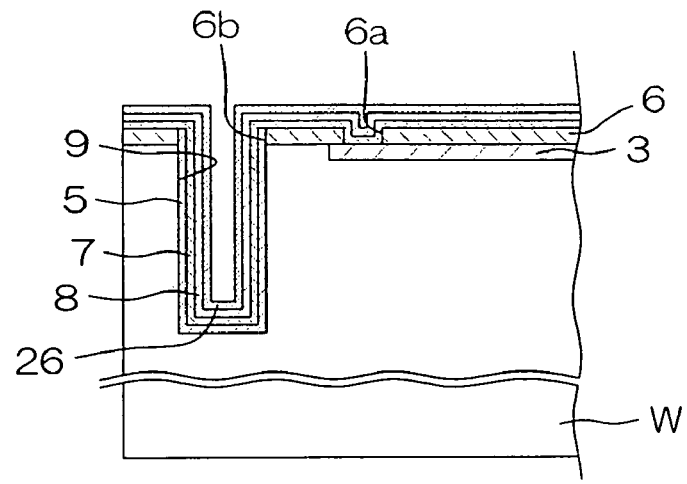
FIG. 6($a$) through FIG. 6($c$) are illustrative sectional views for explaining a manufacturing method for the semiconductor chip shown in FIG. 5.
Figure 6:
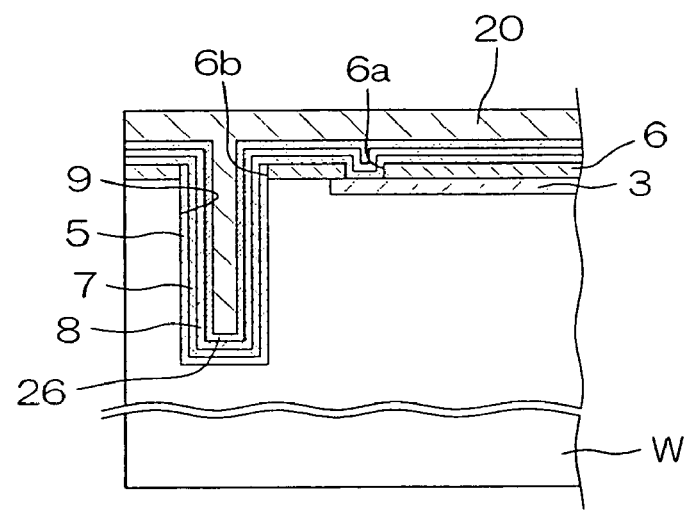
Figure 6:
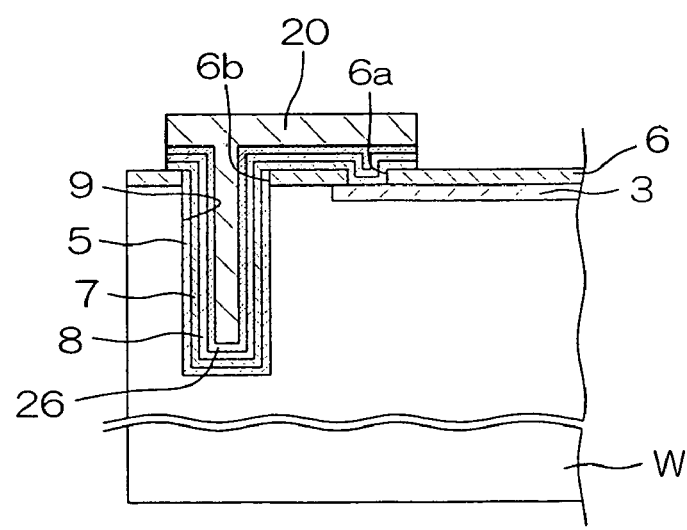

FIG. 6(a) through FIG. 6(c) are illustrative sectional views for explaining a manufacturing method for the semiconductor chip 25 shown in FIG. 5.

After the steps up to the step of forming the oxidation preventive film 8 (see FIG. 2(c)) are performed in the same manner as in the manufacturing method for the semiconductor chip 1, without performing the step of supplying the low melting point metal paste 18 (see FIG. 2(d)), titanium and tungsten are supplied or titanium is supplied singly to the entire exposed surface of the wafer W front surface side including the inside of the concave portion 9 to form the intermetallic diffusion preventive film 26 (see FIG. 6(a)). This step can be performed by electroless plating, sputtering, or CVD.

Next, the step of supplying the metal material 20 (including the step of forming a seed layer when the metal material 20 is supplied by electrolytic plating) is performed in the same manner as in the manufacturing method for the semiconductor chip 1 (see FIG. 2(f)). Thereby, as shown in FIG. 6(b), the inside of the concave portion 9 including the bottom thereof is filled up with the metal material 20.

Subsequently, portions of the metal material 20 (including the seed layer when it is formed by electrolytic plating), the intermetallic diffusion preventive film 26, the oxidation preventive film 8, and the diffusion preventive film 7 except for a predetermined region including the inside of the concave portion 9, the insides of the openings 6a and 6b, and the surface of the hard mask 6 between these, are removed. This condition is shown in FIG. 6(c). Thereafter, the step of forming the UMB layer 13 and the front side protruding electrode 14 (see FIG. 2(h)) and subsequent steps are performed in the same manner as in the manufacturing method for the semiconductor chip 1, whereby the semiconductor chip 25 shown in FIG. 5 is obtained.

Figure 7:
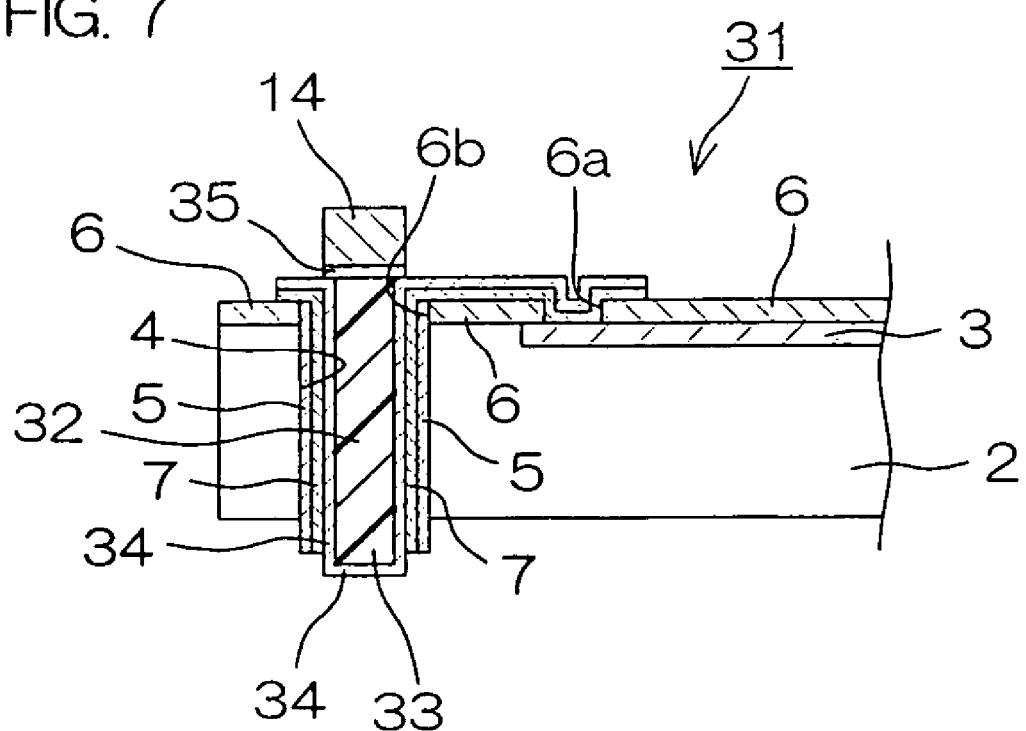
FIG. 7 is an illustrative sectional view showing the structure of a semiconductor chip relating to a fourth embodiment of the invention.

FIG. 7 is an illustrative sectional view showing the structure of a semiconductor chip relating to a fourth embodiment of the invention. In FIG. 7, portions corresponding to parts of the semiconductor chip 21 shown in FIG. 3 are attached with the same reference symbols as in FIG. 3 and description thereof is omitted.

This semiconductor chip 31 has a structure similar to that of the semiconductor chip 21 shown in FIG. 3, however, the penetrating electrode 10 and the interconnection member 11 are not provided, and inside the through hole 4, a polymer 32 made of polyimide, epoxy, phenolic resin, silicone, acryl-based resin, etc., is embedded. Furthermore, in place of the oxidation preventive film 8, a conductive film 34 made of gold, palladium, or an alloy of these is provided.

The polymer 32 protrudes from the rear surface of the semiconductor substrate 2, and this protruding portion is covered by the conductive film 34 and forms a rear side protruding electrode 33. The conductive film 34 is provided so as to be continued to the front surface side of the semiconductor substrate 2 via the inside of the through hole 4, and inside the through hole 4, the conductive film 34 is interposed between the polymer 32 and the diffusion preventive film 7, and is provided on the diffusion preventive film 7 on the front surface side of the semiconductor substrate 2. The rear side protruding electrode 33 is electrically connected to the function device 3 by the conductive film 34 and the diffusion preventive film 7.

On the front surface of the semiconductor substrate 2, the surface of the polymer 32 and the surface of the diffusion preventive film 7 in the vicinity of the surface of the polymer 32 are flush (formed at roughly the same level), and an interconnection layer 35 is provided so as to cover the surface of the polymer 32 and the diffusion preventive film 7 in the vicinity of the surface of the polymer 32. The polymer 32 is not exposed between the conductive film 34 and the interconnection layer 35. The interconnection layer 35 and the conductive film 34 are electrically connected to each other.

On the interconnection layer 35, the front side protruding electrode 14 is formed. In the vertical top plan view of the semiconductor substrate 2, the front side protruding electrode 14 is larger than the polymer 32, and the region in which the polymer 32 is formed is completely included within the region in which the front side protruding electrode 14 is formed. The front side protruding electrode 14 is electrically connected to the function device 3 via the interconnection layer 35, the conductive film 34, and the diffusion preventive film 7.

This semiconductor chip 31 can be connected to electrode pads formed on a wiring board or the front side protruding electrodes 14 of another semiconductor chip 1, 21, 25, or 31 by the rear side protruding electrodes of the semiconductor chips 1, 21, and 25. This semiconductor chip 31 can also be connected to the rear side protruding electrode 15, 22, or 33 of another semiconductor chip 1, 21, 25, or 31 by the front side protruding electrodes 14.

The polymer 32 can be deformed easily in comparison with metal materials. Therefore, even when a stress is applied to the semiconductor chip 31 while the semiconductor chip 31 is joined to another semiconductor chip 1, 21, 25, or 31 via the front side protruding electrodes 14, such a stress can be eased by the polymer 32. Particularly, the polymer 32 made of polyimide can provide a high stress easing effect and has high tenacity.

Therefore, the junction portion between the front side protruding electrode 14 and the rear side protruding electrode 15, 22, or 33 of another semiconductor chip 1, 21, 25, or 31 is hardly broken. Namely, this semiconductor chip 31 is high in connection reliability.

Figure 8:
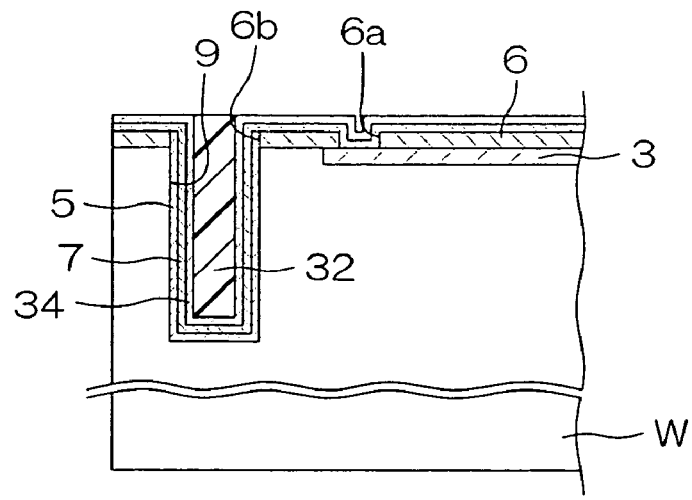
FIG. 8($a$) through FIG. 8($c$) are illustrative sectional views for explaining a manufacturing method for the semiconductor chip shown in FIG. 7.
Figure 8:
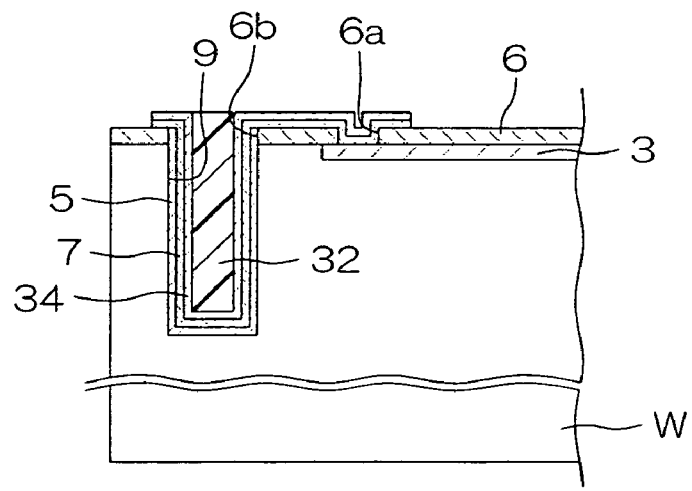
Figure 8:
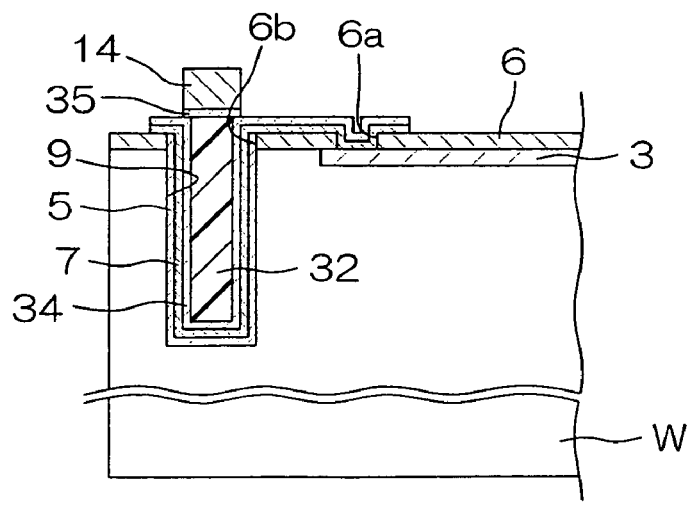

FIG. 8(a) through FIG. 8(c) are illustrative sectional views for explaining a manufacturing method for the semiconductor chip 31 shown in FIG. 7.

After the steps up to the step of forming the diffusion preventive film 7 (see FIG. 2(b)) are performed in the same manner as in the manufacturing method for the semiconductor chip 1, the conductive film 34 is formed in the same manner as in forming the oxidation preventive film 8 (see FIG. 2(c)).

Next, a liquid polymer 32 is filled to the inside of the concave portion 9 and then solidified. The surface of the polymer 32 and the surface of the diffusion preventive film 7 in the vicinity of the surface of the polymer 32 are formed at the same level. This condition is shown in FIG. 8(a).

Subsequently, by using a predetermined pattern mask, portions of the conductive film 34 and the diffusion preventive film 7 except for a predetermined region including the concave portion 9 (opening 6b) and the opening 6a in the vertical top plan view of the wafer W are removed by etching. This condition is shown in FIG. 8(b).

Next, on the front surface of the wafer w, an interconnection layer 35 is formed so as to cover the surface of the polymer 32 and the diffusion preventive film 7 in the vicinity of the surface of the polymer 32, and furthermore, on the interconnection layer 35, the front side protruding electrode 14 is formed. This condition is shown in FIG. 8(c).

Thereafter, the wafer W is removed from the rear surface by dry etching, and the step of thinning the thickness of the wafer W to be smaller than the depth of the concave portion 9 (see FIG. 2(i)) and the subsequent steps are performed in the same manner as in the manufacturing method for the semiconductor chip 1, whereby the semiconductor chip 31 shown in FIG. 7 is obtained.

Figure 9:
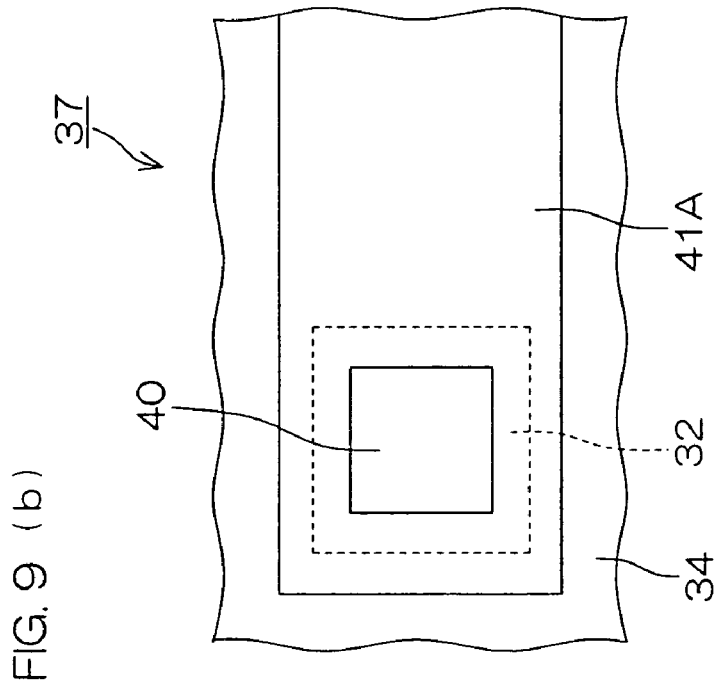
FIG. 9($a$) is an illustrative sectional view showing the structure of a semiconductor chip relating to a modification of the semiconductor chip shown in FIG. 7.
Figure 9:
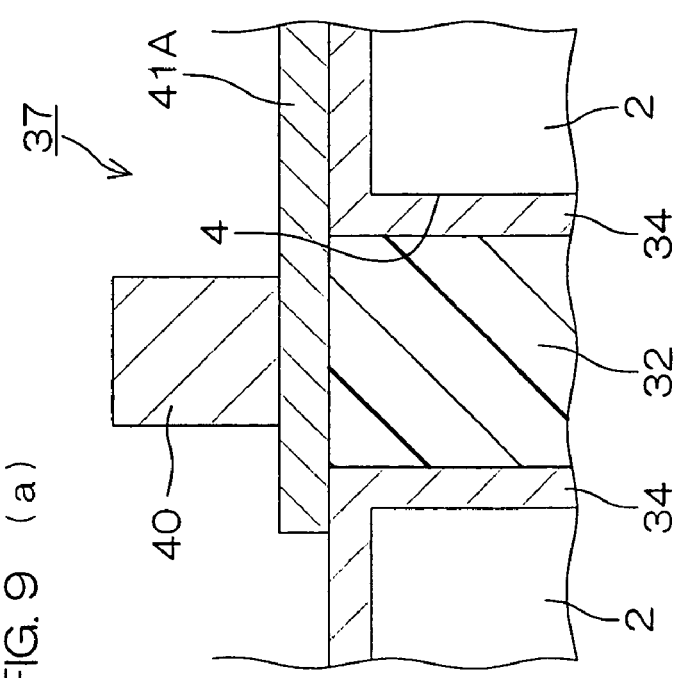

FIG. 9(a), FIG. 9(b), FIG. 10(a), FIG. 10(b), and FIG. 11(a) through FIG. 11(c) are illustrative sectional views (FIG. 9(a), FIG. 10(a), and FIG. 11(a)) and plan views (FIG. 9(b), FIG. 10(b), FIG. 11(b), and FIG. 11(c)) showing the structure of semiconductor chips relating to modifications of the semiconductor chip 31 shown in FIG. 7. In FIG. 9(a), FIG. 9(b), FIG. 10(a), FIG. 10(b), and FIG. 11(a) through FIG. 11(c), portions corresponding to the parts of the semiconductor chip 31 shown in FIG. 7 are attached with the same symbols as in FIG. 7 and description thereof is omitted.

In the vertical top plan view of the semiconductor substrate 2, all the semiconductor chips 37, 38, and 39 have the front side protruding electrode 40 smaller than the polymer 33, and the region in which the front side protruding electrode 40 is formed is completely included in the region in which the polymer 33 is formed. The forms of the through hole 4, the polymer 32, and the front side protruding electrode 40 in the plan view are quadrilaterals (roughly squares).

In the semiconductor chip 37 shown in FIG. 9(a) and FIG. 9(b), an interconnection layer 41A having a band shape with a width larger than the length of one side of the through hole 4 (the inner circumference of the conductive film 34) is provided so as to completely cover the polymer 32 (see FIG. 9(b)). The front side protruding electrode 40 is provided on the interconnection layer 41A.

In this case, the interconnection layer 41A is joined to the conductive film 34 across the entire circumference of the edge of the through hole 4, so that the interconnection layer 41A cannot move widely with respect to the semiconductor substrate 2. Therefore, when a stress is applied to the semiconductor chip 37 while the front side protruding electrode 40 is joined to the rear side protruding electrode 15, 22, or 33 of another semiconductor chip 1, 21, 25, or 31, this stress is not sufficiently eased by the polymer 32.

In the semiconductor chip 38 shown in FIG. 10(a) and FIG. 10(b), in place of the interconnection layer 41A of the semiconductor chip 37, a band-shaped interconnection layer 41B which has an almost constant width smaller than one side length of the through hole 4 (the inner circumference of the conductive film 34) and larger than the width of the front side protruding electrode 40 is provided. By referring to FIG. 10(b), the interconnection layer 41B is not in contact with three sides of the four sides of the through hole 4 (the inner circumference of the conductive film 34), and between the three sides and the interconnection layer 41B, the polymer 32 is exposed. The front side protruding electrode 40 is provided on the interconnection layer 41B.

In this case, in comparison with the interconnection layer 41A of the semiconductor chip 37 shown in FIG. 9(a) and FIG. 9(b), the junction portion of the interconnection layer 41B with the conductive layer 34 around the polymer 32 is remarkably reduced, and thereby, the interconnection layer 41B on the polymer 32 can widely move particularly in the direction perpendicular to the semiconductor substrate 2 (so as to pivot around the portion of the junction with the conductive layer 34). Therefore, when a stress is applied to the semiconductor chip 38 while the front side protruding electrode 40 is joined to the rear side protruding electrode 15, 22, or 33 of another semiconductor chip 1, 21, 25, or 31, this stress is effectively eased by the polymer 32.

In the semiconductor chip 39 shown in FIG. 11(a) through FIG. 11(c), the width of the interconnection layer 41C is also formed to be smaller than one side length of the through hole 4 (the inner circumference of the conductive film 34), however, in the interconnection layer 41C, the width of the portion extended from the polymer 32 to the surface of the conductive layer 34 (hereinafter, referred to as "extended portion") is set smaller than the width of the portion at the center of the surface of the polymer 32 (hereinafter, referred to as "above-polymer portion").

Thereby, in comparison with the semiconductor chip 38 shown in FIG. 10(a) and FIG. 10(b), the junction portion between the interconnection layer 41C and the conductive film 34 is reduced further, and the exposed area of the polymer 32 between the edge portion of the through hole 4 (the inner circumference of the conductive film 34) and the interconnection layer 41C becomes larger. Therefore, the interconnection layer 41C on the polymer 32 can move more widely with respect to the semiconductor substrate 2. Therefore, when a stress is applied to the semiconductor chip 39 while the front side protruding electrode 40 is joined to the rear side protruding electrode 15, 22, or 33 of another semiconductor chip 1, 21, 25, or 31, this stress is more effectively eased by the polymer 32.

In the interconnection layer 41C shown in FIG. 11(b), the edges of the above-polymer portion and the edges of the extended portion form corners. In this case, a crack is easily created between the above-polymer portion and the extended portion to cause breakage.

On the other hand, the interconnection layer 41D shown in FIG. 11(c) has a so-called tear drop form, and the edges of the above-polymer portion and the edges of the extended portion form curves. In this case, a crack is hardly created between the above-polymer portion and the extended portion, that is, hardly causes breakage.

Figure 12:
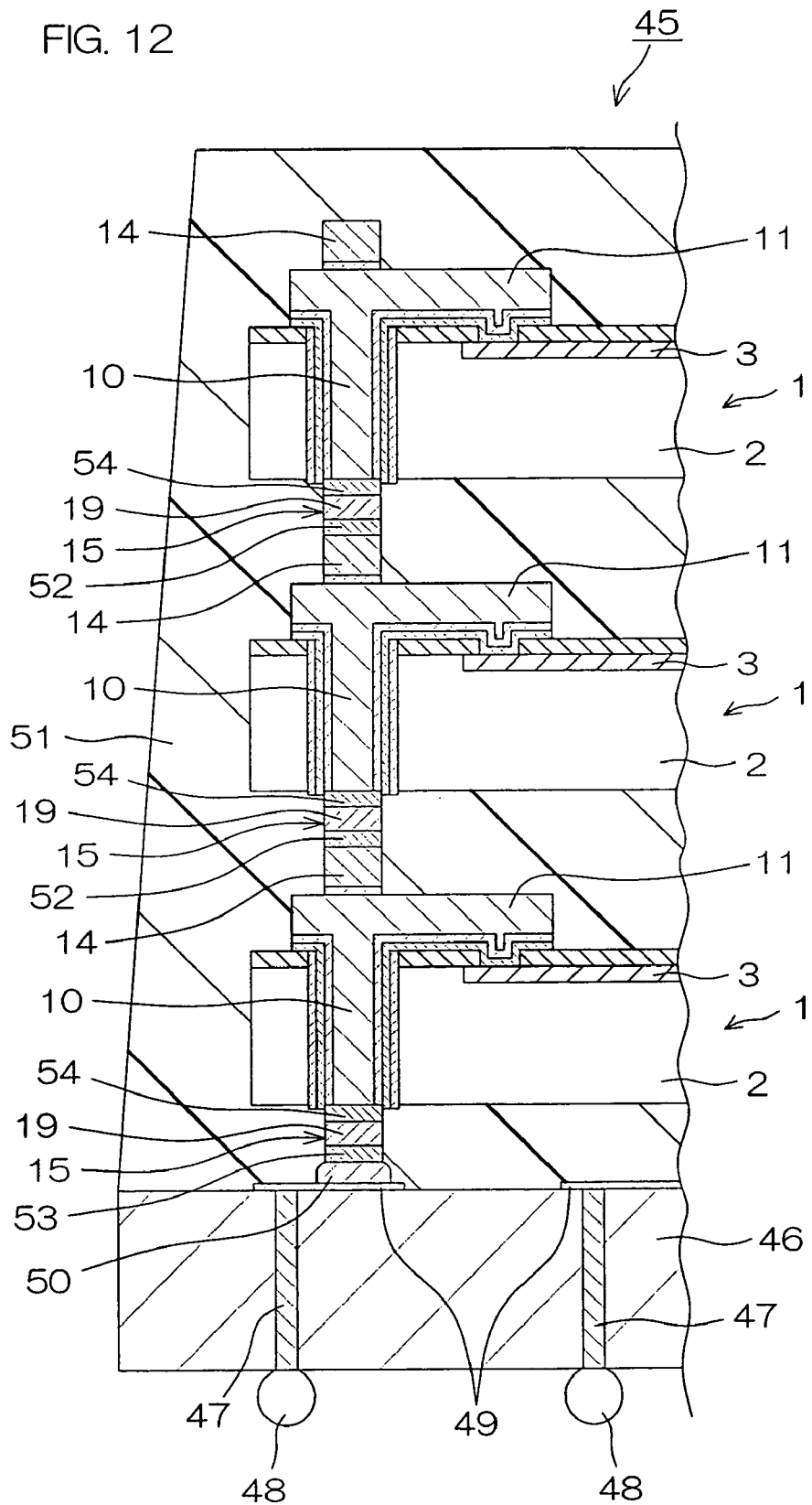
FIG. 12 is an illustrative sectional view showing the structure of a first semiconductor device including a plurality of semiconductor chips shown in FIG. 1.

FIG. 12 is an illustrative sectional view showing the structure of a first semiconductor device including a plurality of semiconductor chips 1 shown in FIG. 1. This semiconductor device has a so-called BGA (Ball Grid Array) type package form, and has a wiring board 46 and a plurality (three in this embodiment) of semiconductor chips 1 stacked on the wiring board 46.

The wiring board 46 is made of an insulating material. On the wiring board 46, penetrating electrodes 47 penetrating the wiring board 46 in the thickness direction are formed. To the penetrating electrodes 47 on one surface side of the wiring board 46, metal balls (for example, solder balls) 48 are joined. On the surface opposite the metal ball 48 side of the wiring board 46, wiring 49 with a predetermined pattern is formed. The wiring 49 is electrically connected to the penetrating electrodes 47, and on a predetermined portion of the wiring 49, a bump 50 made of a metal is formed.

The plurality of semiconductor chips 1 are arranged so that the semiconductor substrates 2 are almost parallel to the wiring board 46. In this embodiment, the front surfaces of the semiconductor chips 1 (the surfaces on which the function devices 3 are formed) are turned to the side opposite the wiring board 46 side, however, it is also possible that the front surfaces of the semiconductor chips 1 are turned to the wiring board 46 side.

The bump 50 of the wiring board 46 is joined to the rear side protruding electrode 15 of the semiconductor chip 1. In two adjacent semiconductor chips 1, the front side protruding electrode 14 of one semiconductor chip 1 and the rear side protruding electrode 15 of the other semiconductor chip 1 are joined to each other.

Between the low melting point metal layer 19 of the rear side protruding electrode 15 and the front side protruding electrode 14, an alloy layer 52 (a layer containing an intermetallic compound or a solid solution or a layer made of a eutectic) is formed. The alloy layer 52 contains the metal forming the low melting point metal layer 19 and the metal forming the front side protruding electrode 14. Likewise, between the low melting point metal layer 19 of the rear side protruding electrode 15 and the bump 50, an alloy layer 53 is formed. The alloy layer 53 contains the metal forming the low melting point metal layer 19 and the metal forming the bump 50.

Furthermore, between the low melting point metal layer 19 and the penetrating electrode 10, an alloy layer 54 containing the metal forming the low melting point metal layer 19 and the metal forming the penetrating electrode 10 is formed. Between the alloy layer 54 and the alloy layer 52 and between the alloy layer 54 and the alloy layer 53, the low melting point metal layers 19 exist.

Furthermore, the oxidation preventive films 8 (see FIG. 1) covering the low melting point metal layers 19 are taken into the low melting point metal layers 19 (rear side protruding electrodes 15) and the alloy layers 52, 53, and 54 and disappear.

Thus, the three semiconductor chips 1 are stacked in the thickness direction. The plurality of semiconductor chips 1 and the surface of the wiring board 46 on which the wiring 49 is formed are sealed by a sealing resin (mold resin) 51.

With the above-mentioned construction, the function devices 3 provided on the respective semiconductor chips 1 are electrically connected to a predetermined metal ball 48 via the interconnection members 11, the penetrating electrodes 10, the rear side protruding electrodes 15, the front side protruding electrodes 14, the bump 50, the wiring 49, and the penetrating electrode 47. The penetrating electrodes 10 provided on the respective semiconductor chips 1 are aligned roughly along a line, so that the function devices 3 of the semiconductor chips 1 which are not adjacent to the wiring board 46 are also connected to the wiring 49 on the wiring board 46 with a short distance.

This semiconductor device 45 can be mounted on another wiring board via the metal balls 48. Thereby, the function device 3 can be electrically connected to another wiring board. Due to layering of a plurality of semiconductor chips 1, the mounting area for this semiconductor device 45 becomes small.

Since the surface of the top semiconductor chip 1 (the furthest from the wiring board 46) on which the function device 3 is formed is turned toward the side opposite the wiring board 46 side, this semiconductor device 45 has the following advantages.

As a first advantage, the function device 3 of the top semiconductor chip 1 can be a light receiving element or a light emitting element, and light receiving or emission is possible through this light receiving element or light emitting element. In this case, the sealing resin 51 may be made of a transparent resin. Thereby, it is possible that light from the outside of the semiconductor device 45 is received and converted into an electrical signal by the top semiconductor chip 1, and on the basis of a supplied electrical signal, light is generated by the semiconductor chip 1 and taken out of the semiconductor device 45.

The semiconductor device 45 can be, for example, an image sensor module, and in this case, the top semiconductor chip 1 may be a CCD (Charge-Coupled Device) chip having a plurality of light receiving elements as the function device 3 or a CMOS (Complementary Metal Oxide Semiconductor) sensor chip.

Furthermore, the semiconductor device 45 may be for infrared communications, and in this case, the top semiconductor chip 1 has an infrared emitting and receiving element as the function device 3.

Other semiconductor chips 1 (other than the top chip) may include a control chip or a memory chip.

As a second advantage, it is possible that on the surface of the top semiconductor chip on which the function device 3 is formed, predetermined wiring is provided and the electrical characteristics of the semiconductor chip 1 can be adjusted by trimming the wiring by a laser beam, etc. In this case, after the semiconductor chips 1 are all stacked on the wiring board 46 and electrically connected, by applying the above-mentioned trimming to the top semiconductor chip 1 before molding the sealing resin 51, the electrical characteristics of the entire semiconductor device 45 can be adjusted (for example, the plurality of semiconductor chips 1 are electrically synchronized), and therefore, the yield of the semiconductor device 45 is improved.

The construction of the semiconductor device 45 can be changed as appropriate, and for example, on the front surface of the top semiconductor chip 1, it is not necessary to provide the front side protruding electrode 14.

Such a semiconductor device 45 can be formed by layering and joining semiconductor chips 1 in order on the wiring board 46. In this case, while the rear side protruding electrodes 15 and the front side protruding electrodes 14 or bump 50 are made to contact with each other, the semiconductor chips 1 are heated to a temperature equal to or higher than the solidus temperature (preferably, equal to or higher than the liquidus temperature) of the low melting point metal forming the low melting point metal layers 19 for a predetermined period of time.

Thereby, a melt of the low melting point metal layers 19 is produced, and the metals forming the front side protruding electrodes 14, the bump 50, the penetrating electrodes 10 (the remainders 12 of the rear side protruding electrodes 15) and the oxidation preventive films 8 are taken into this melt, and this melt is solidified, whereby the alloy layers 52, 53, and 54 are formed. By covering the rear side protruding electrodes 15 before being joined by the oxidation preventive films 8, no oxide film is formed on the surfaces of the rear side protruding electrodes 15, so that these alloy layers 52 and 53 are formed easily.

The rear side protruding electrodes 15 and the front side protruding electrodes 14, and the rear side protrusion electrode 15 and the bump 50 are joined with high junction strength via the alloy layers 52 and 53, and are well connected electrically.

Figure 13:
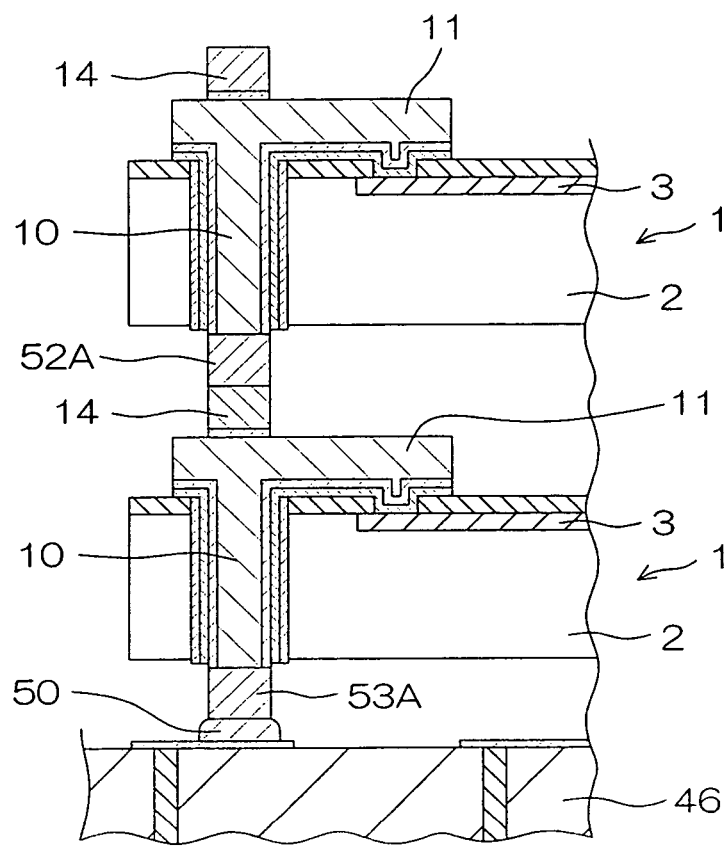
FIG. 13 is an illustrative sectional view showing the structure of a semiconductor device relating to a modification of the semiconductor device shown in FIG. 12 in its manufacturing process.

FIG. 13 is an illustrative sectional view showing the structure in a manufacturing process of a semiconductor device relating to a modification of the semiconductor device 45 shown in FIG. 12. In FIG. 13, portions corresponding to the parts of the semiconductor device 45 shown in FIG. 12 are attached with the same reference symbols as in FIG. 12 and description thereof is omitted.

This semiconductor device is obtained by changing the heating condition when the wiring board 46 and the semiconductor chip 1 are joined to each other and when the semiconductor chips 1 are joined to each other from the heating condition in the case of the semiconductor device 45 shown in FIG. 12.

On the junction portion between two adjacent semiconductor chips 1, no low melting point metal layer 19 exists, and between the front side protruding electrode 14 of one semiconductor chip 1 and the penetrating electrode 10 of the other semiconductor chip 1, an alloy layer 52A is formed. The alloy layer 52A contains the metal forming the low melting point metal layer 19, the metal forming the front side protruding electrode 14, the metal forming the penetrating electrode 10, and the metal forming the oxidation preventive film 8.

On the junction portion between the lowest (nearest to the wiring board 46) semiconductor chip 1 and the wiring board 46, no low melting point metal layer 19 exists, and between the penetrating electrode 10 of this semiconductor chip 1 and the bump 50 of the wiring board 46, an alloy layer 53A is formed. The alloy layer 53A contains the metal forming the low melting point metal layer 19, the metal forming the bump 50, the metal forming the penetrating electrode 10, and the metal forming the oxidation preventive film 8.

Such a semiconductor device is obtained by setting a high heating temperature and/or a long heating period when the wiring board 46 and the semiconductor chip 1 are joined to each other and when the semiconductor chips 1 are joined to each other in comparison with the case of manufacturing the semiconductor device 45. Thereby, reaction between the melt of the low melting point metal layers 19 and the front side protruding electrodes 14, the penetrating electrodes 10, the bumps 50, and the oxidation preventive films 8 is further promoted, and larger amounts of the metals forming the front side protruding electrodes 14, the penetrating electrodes 10, the bumps 50, and the oxidation preventive films 8 are taken into this melt and diffused in the entirety of the melt. By solidifying this melt, the alloy layers 52A and 53A are formed.

Even in identical heating conditions, when the amount of the low melting point metal layers 19 is large, like the semiconductor device 45 shown in FIG. 12, a structure in which the low melting point metal layers 19 exist between the penetrating electrodes 10 and the front side protruding electrodes 14 or bumps 50 (between the alloy layer 54 and the alloy layer 52 or 53) is easily obtained, and when the amount of the low melting point metal layers 19 is small, like the semiconductor device shown in FIG. 13, a structure without the low melting point metal layers 19 is easily obtained.

As described above, by selecting an appropriate heating condition and an appropriate amount of the low melting point metal layers 19, the semiconductor device 45 having the structure shown in FIG. 12 or the semiconductor device having the structure shown in FIG. 13 can be selectively obtained.

Figure 14:
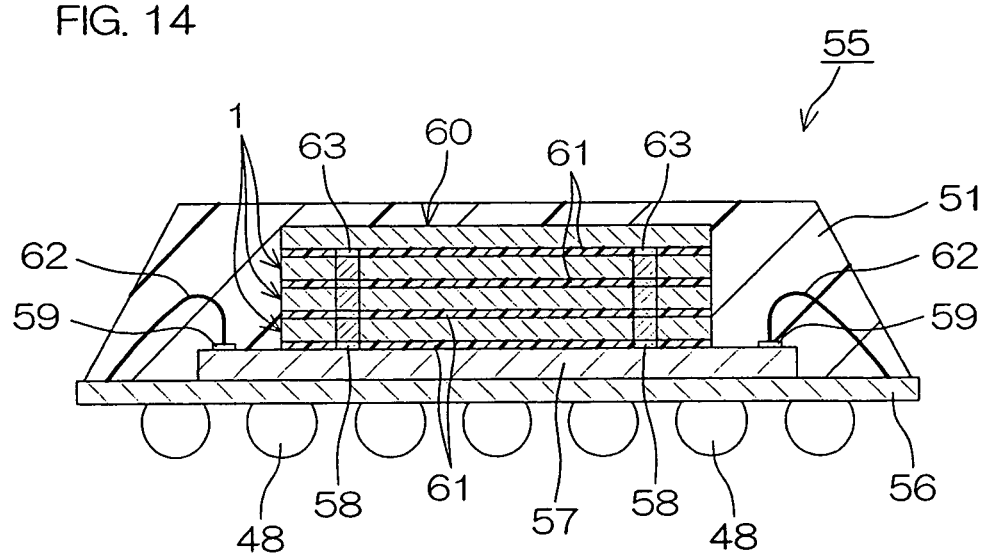
FIG. 14 is an illustrative sectional view showing the structure of a second semiconductor device including a plurality of semiconductor chips shown in FIG. 1.

FIG. 14 is an illustrative sectional view showing the structure of a second semiconductor device including a plurality of semiconductor chips 1 shown in FIG. 1. In FIG. 14, portions corresponding to the parts of the semiconductor device 45 shown in FIG. 12 are attached with the same reference symbols as in FIG. 12 and description thereof is omitted.

This semiconductor device 55 also has a BGA type package form, wherein a wiring board (interposer) 56 and metal balls 48 are provided. On the wiring board 56, a solid state device 57 such as a semiconductor chip, a plurality (three in this embodiment) of semiconductor chips 1, and a semiconductor chip 60 that has no penetrating electrode are stacked in order.

In a plan view of the wiring board 56 and the solid state device 57 from above in the thickness direction, the wiring board 56 is larger than the solid state device 57, and in a plan view of the solid state device 57 and the semiconductor chips 1 and 60 from above in the thickness direction, the solid state device 57 is larger than the semiconductor chips 1 and 60. The plurality of semiconductor chips 1 and the semiconductor chip 60 have almost the same size and the same form in a plan view of these from above in the thickness direction, and are arranged so as to almost overlap.

On one surface of the semiconductor chip 60, a function device equivalent to that of the semiconductor chip 1 is formed, and the surface with this function device formed is turned toward the solid state device 57 side. In this embodiment, the surfaces with the function devices 3 (active layers) of the plurality of semiconductor chips 1 are all turned toward the solid state device 57 side, however, they may be turned toward the side opposite the solid state device 57.

On the outer circumference of one surface of the wiring board 56, regions which the solid state device 57 does not face are provided with electrode pads (not shown), and the electrode pads are re-wired on the inside and the surface of the wiring board 56 and electrically connected to the metal balls 48 provided on the other surface of the wiring board 56.

On the outer circumference of one surface of the solid state device 57 (the opposite side of the wiring board 56), in regions which the semiconductor chip 1 does not face, electrode pads 59 are formed. The electrode pads provided on the wiring board 56 and the electrode pads 59 of the solid state device 57 are electrically connected by bonding wires 62.

In inner regions of the one surface of the solid state device 57, at positions corresponding to the front side protruding electrodes 14 of the semiconductor chips 1, electrode pads 58 are formed. The front side protruding electrodes 14 of the semiconductor chip 1 adjacent to the solid state device 57 are joined to the electrode pads 58. Furthermore, in two adjacent semiconductor chips 1, the front side protruding electrode 14 of one semiconductor chip 1 and the rear side protruding electrode 15 of the other semiconductor chip 1 are joined in the same manner as in the semiconductor device 45 shown in FIG. 12 or the semiconductor device shown in FIG. 13.

On the surface of the semiconductor chip 60 on which the function device is formed, protruding electrodes 63 electrically connected to this function device are formed at the positions corresponding to the rear side protruding electrodes 15 of the semiconductor chip 1, and the protruding electrodes 63 are joined to the rear side protruding electrodes 15 of the top (the furthest from the solid state device 57) semiconductor chip 1.

The gaps between the semiconductor chips 1 and 60 and between the semiconductor chip 1 and the solid state device 57 are sealed by interlayer sealing materials 61.

Referring to FIG. 1 and FIG. 14, with the above-mentioned construction, the function devices 3 provided on the respective semiconductor chips 1 and 60 are electrically connected to predetermined metal balls 48 via the interconnection members 11, the penetrating electrodes 10, the protruding electrodes 63, the rear side protruding electrodes 15, the front side protruding electrodes 14, the electrode pads 58, the solid state device 57, the electrode pads 59, the bonding wires 62, and the wiring board 56.

Figure 15:
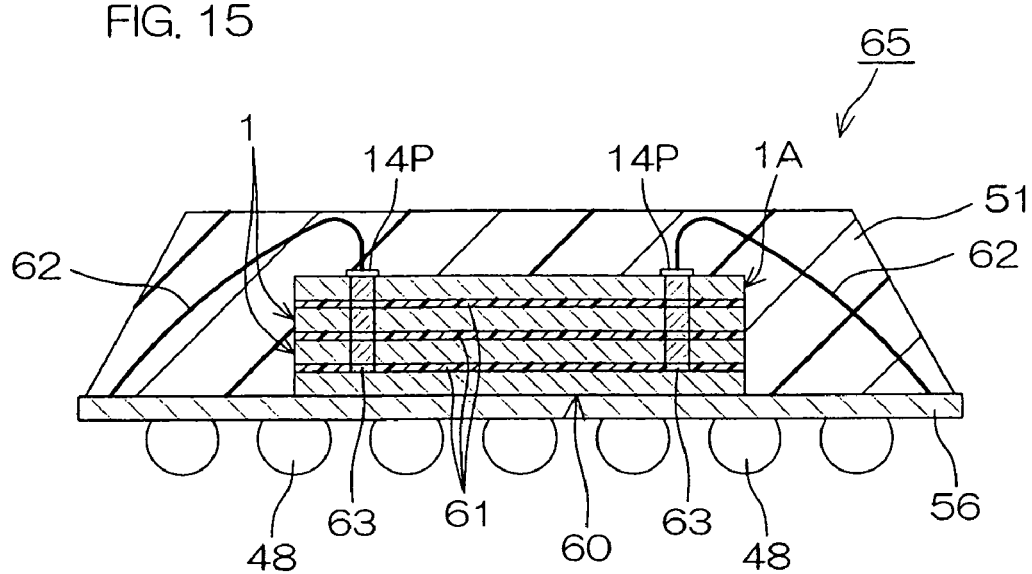
FIG. 15 is an illustrative sectional view showing the structure of a third semiconductor device including a plurality of semiconductor chips shown in FIG. 1.

FIG. 15 is an illustrative sectional view showing the structure of a third semiconductor device including a plurality of semiconductor chips 1 shown in FIG. 1. In FIG. 15, portions corresponding to the parts of the semiconductor device 55 shown in FIG. 14 are attached with the same reference symbols as in FIG. 14 and description thereof is omitted.

This semiconductor device 65 has a structure similar to that of the semiconductor device 55 shown in FIG. 14, however, it includes no solid state device 57, and on the wiring board 56, a semiconductor chip 60, a plurality of semiconductor chips 1, and a semiconductor chip 1A are stacked in order. The top (the furthest from the wiring board 56) semiconductor chip 1A has a structure similar to that of the semiconductor chip 1, however, in place of the front side protruding electrodes 14, electrode pads 14P are provided. The electrode pads 14P are connected to the electrode pads of the wiring board 56 via bonding wires 62.

The surfaces of the semiconductor chips 1, 60, and 1A on which the function devices 3 are formed are all turned toward the opposite side of the wiring board 56 in this embodiment. Between the wiring board 56 and the semiconductor chip 60, no interlayer sealing member 61 is interposed, and the wiring board 56 and the semiconductor chip 60 are directly joined.

Referring to FIG. 1 and FIG. 15, with the above-mentioned construction, the function devices 3 provided on the semiconductor chips 60, 1A, and 1 are electrically connected to predetermined metal balls 48 via the interconnection members 11, the penetrating electrodes 10, the protruding electrodes 63, the rear side protruding electrodes 15, the front side protruding electrodes 14, the electrode pads 14P, the bonding wires 62, and the wiring board 56.

Figure 16:
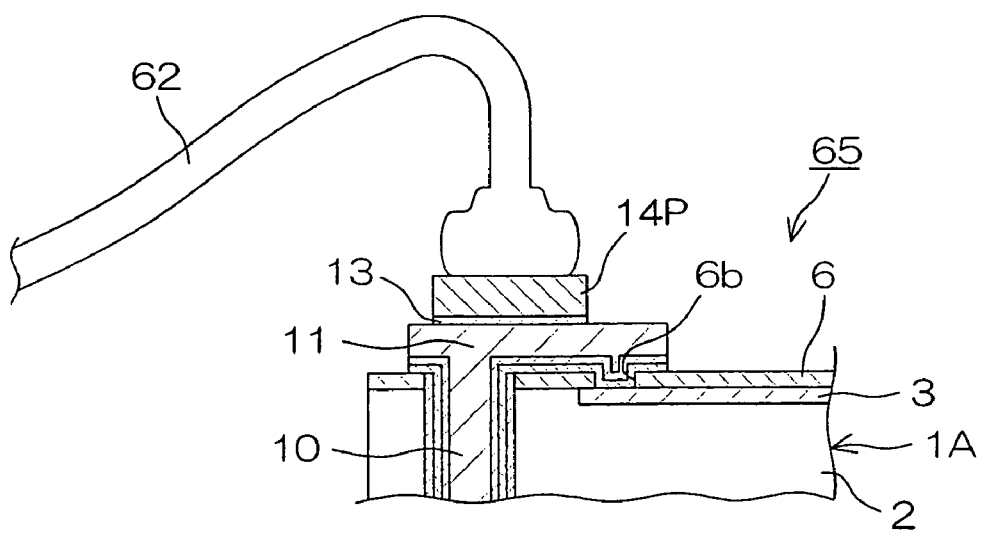
FIG. 16 is an illustrative sectional view showing an enlargement of the vicinity of a connection part between a bonding wire and an electrode pad of the semiconductor device shown in FIG. 15.

FIG. 16 is an illustrative sectional view showing the vicinity of the connection part between the bonding wire 62 and the electrode pad 14P in an enlarged manner.

The electrode pad 14P is formed so as to have an area larger than the front side protruding electrode 14 in the vertical top plan view of the semiconductor substrate 2 so that a wire can be bonded easily thereon. When the area of the electrode pad 14P is sufficiently large, the bonding wire 62 can be bonded at an arbitrary position on the electrode pad 14P.

Furthermore, the bonding wire 62 is not directly bonded to the interconnection member 11, but is bonded to the electrode pad 14P provided on the interconnection member 11. Therefore, even when the material forming the interconnection member 11 is not suitable for bonding with the bonding wire 62, by selecting a proper material as a material forming the electrode pad 14P, the bonding wire 62 can be excellently bonded to the electrode pad 14P.

Impact applied when the wire is bonded is absorbed to some degree by the electrode pad 14P, so that the impact to be applied to the structural parts existing below the interconnection member 11 (semiconductor substrate 2 side) is eased. Therefore, without damaging the function device 3, it is also possible that the bonding wire 62 is bonded to the position, for example, above the function device 3 on the electrode pads 14P or in the vicinity thereof.

Figure 17:
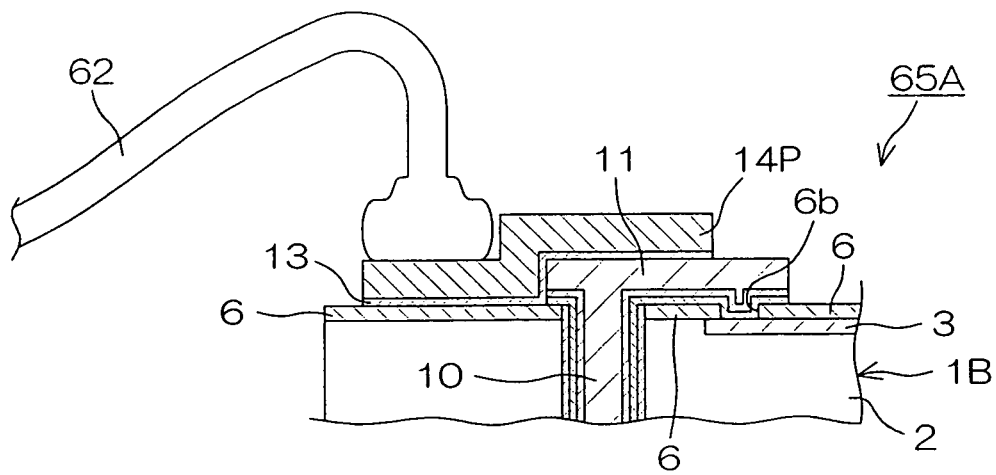
FIG. 17(a) through FIG. 17(c) are illustrative sectional views showing the structures of a semiconductor devices relating to a modifications of the semiconductor device shown in FIG. 15.
Figure 17:
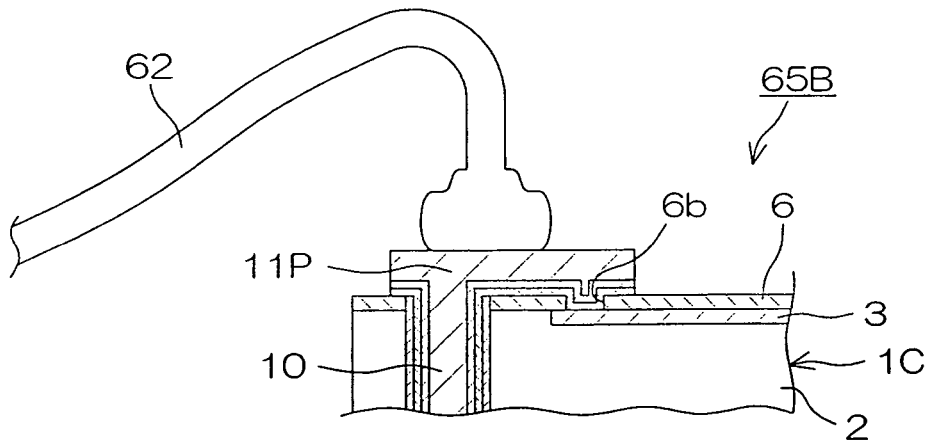
Figure 17:
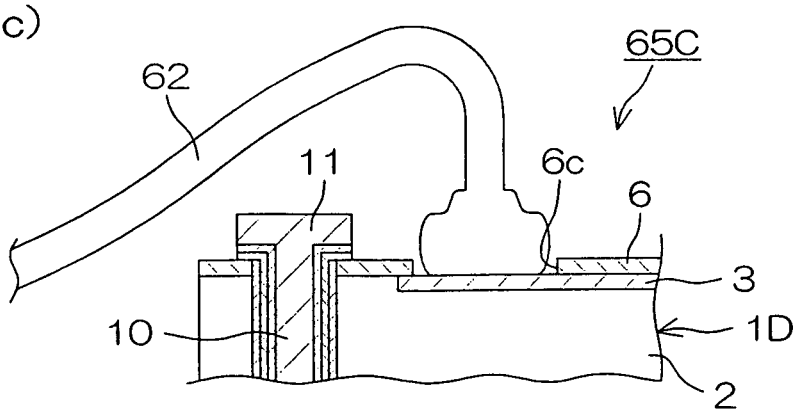
Figure 20:
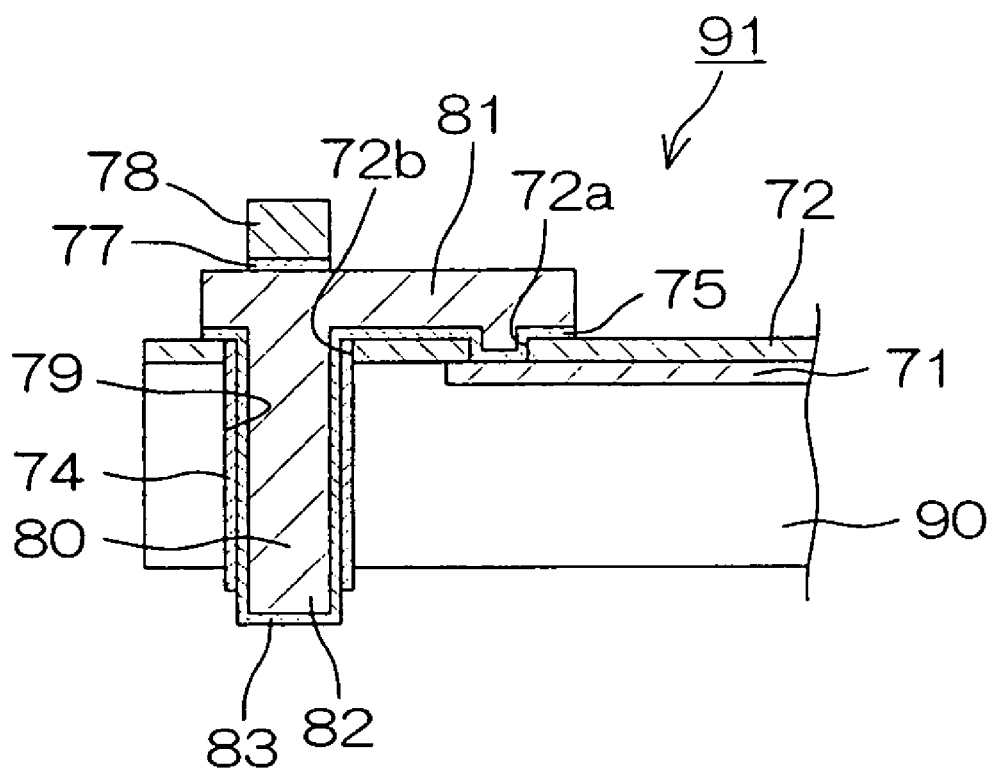
FIG. 20 is an illustrative sectional view showing the structure of a semiconductor chip having a conventional penetrating electrode.
Figure 21:
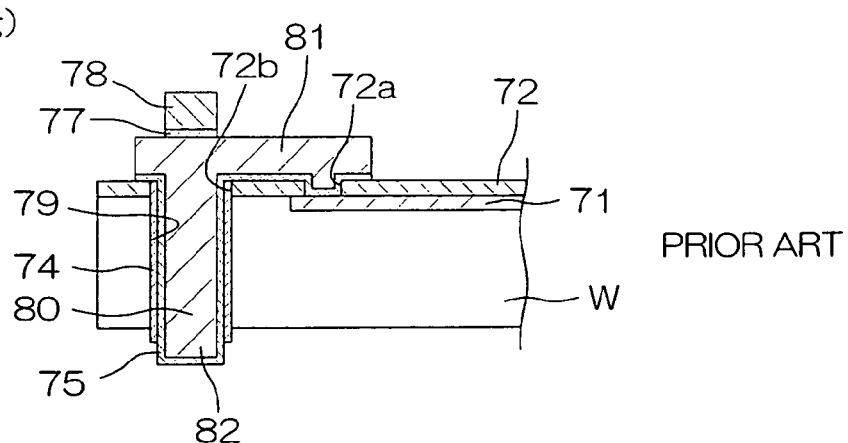
FIG. 21(a) through FIG. 21(h) are illustrative sectional views for explaining a manufacturing method for the semiconductor chip shown in FIG. 20.
Figure 21:
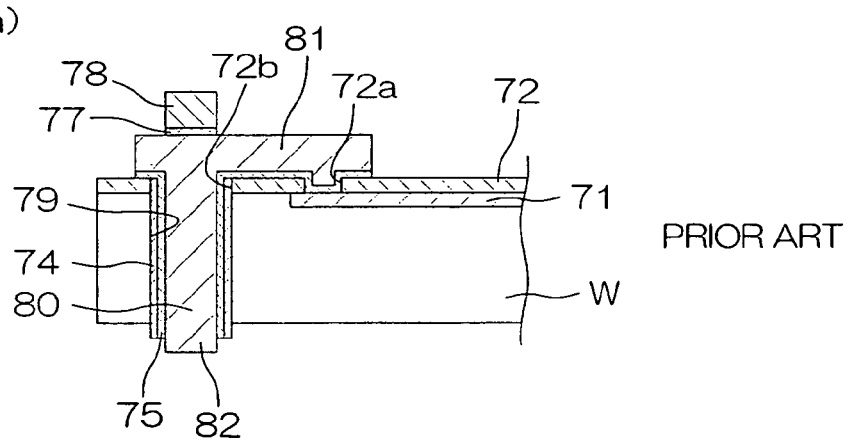

FIG. 17(a) through FIG. 17(c) are illustrative sectional views showing the structures of the semiconductor devices 65A, 65B, and 65C relating to modifications of the semiconductor device 65. In FIG. 17(a) through FIG. 17(c), portions corresponding to the parts of the semiconductor device 65 shown in FIG. 15 are attached with the same reference symbols as in FIG. 15 and description thereof is omitted. In FIG. 17(a) through FIG. 17(c), the vicinity of the connection part between the bonding wire 62 and the semiconductor chip is shown in an enlarged manner.

The semiconductor device 65A shown in FIG. 17(a) has a semiconductor chip 1B equivalent to the semiconductor chip 1A. This semiconductor chip 1B has electrode pads 14P extended from the surfaces of the interconnection members 11 to portions other than the regions in which the interconnection members 11 (on the hard mask 6) are formed in the vertical top plan view of the semiconductor substrate 2.

The extended portion of the electrode pads 14P is provided on the opposite side of the function device 3 across the penetrating electrode 10 on the front surface of the semiconductor substrate 2 in FIG. 17(a), however, the extended portion may be extended to an arbitrary position on the front surface of the semiconductor substrate 2. The bonding wire 62 is bonded to the extended portion of the electrode pads 14P. The UBM layer 13 is also interposed between the electrode pad 14P and the hard mask 6.

Thus, it is not necessary that the electrode pads 14P are formed so as to be included within the forming regions of the interconnection members 11 in the vertical top plan view of the semiconductor substrate 2 like the semiconductor chip 1A shown in FIG. 16, and the electrode pads may be extended to positions (regions) other than the forming regions of the interconnection members 11 at which wire bonding becomes easier. In other words, the interconnection members 11 do not need to be formed so as to include the positions (regions) at which wire bonding is performed easily on the semiconductor substrate 2.

The semiconductor device 65B shown in FIG. 17(b) has a semiconductor chip 1C equivalent to the semiconductor chip 1A. In the semiconductor chip 1C, an interconnection member 11P equivalent to the interconnection member 11 of the semiconductor chip 1, 1A, or 1B is provided. On the interconnection member 11P, the front side protruding electrode 14, the electrode pad 14P and the UBM layer 13 are not provided, and the bonding wire 62 is directly bonded to the interconnection member 11P. Namely, the interconnection member 11P performs both the role as wiring for electrical connection between the function device 3 and the penetrating electrode 10 and the role as an electrode pad for bonding the bonding wire 62.

The bonding wire 62 can be bonded to an arbitrary position on the interconnection member 11p. Furthermore, the interconnection member 11P may have an electrode pad portion suitable for bonding of the bonding wire 62, and the interconnection member 11P with such a form is obtained by etching the metal material 20 into a predetermined pattern (see FIG. 2(g)).

By forming the interconnection member 11P to be thick, impact when wire-bonding is absorbed to some degree by the interconnection member lip, and impact to be applied to the structural parts existing below the interconnection member 11P can be eased. The thickness of the interconnection member 11P is easily controlled by adjusting the supply amount of the metal material 20 in the step of supplying the metal material 20 onto the front surface of the wafer W by electrolytic plating or the like (see FIG. 2(f)).

Furthermore, this semiconductor device 65B simplifies its manufacturing process since it does not have the electrode pads 14P and the UBM layers 13.

The semiconductor device 65C shown in FIG. 17(c) has a semiconductor chip 1D equivalent to the semiconductor chip 1A. In the hard mask 6 of the semiconductor chip 1D, an opening 6c larger than the opening 6b formed in the hard mask 6 of the semiconductor chip 1, 1A, 1B, or 1C is formed.

The function device 3 includes a device portion and electrodes thereof, and inside the opening 6c, only electrodes in the function device 3 are exposed. Namely, the bonding wire 62 is bonded to the function device 3 by avoiding the device portion.

The interconnection member 11 is not electrically connected to the electrode of the function device 3 (electrode to which the bonding wire 62 is bonded), but is electrically connected to another electrode of the function device 3 at a position excluded from the drawing.

This semiconductor device 65C can be manufactured by applying the conventional wire bonding process for a semiconductor chip.

FIG. 18 is an illustrative sectional view showing the structure of a fourth semiconductor device including a plurality of semiconductor chips 1 shown in FIG. 1. In FIG. 18, portions corresponding to the parts of the semiconductor device 55 shown in FIG. 14 are attached with the same reference symbols as in FIG. 14 and description thereof is omitted.

This semiconductor device 66 has a structure similar to that of the semiconductor device 55 shown in FIG. 14, however, it has a so-called QFN (Quad Flat Non-lead) type package form, and in place of the wiring board 56 and the metal balls 48, a lead frame 67 is provided. The lead frame 67 has a plate shape, and it is disposed almost parallel to the solid state device 57 and the semiconductor chips 1 and 60.

The lead frame 67 comprises a supporting part 67a for supporting the solid state device 57 from below (the opposite side of the semiconductor chip 1), and a plurality of lead terminals 67b arranged within almost the same plane as that of the supporting part 67a by the side of the supporting part 67a.

In a plan view of the supporting part 67a and the solid state device 57 from above in the thickness direction, the supporting part 67a is smaller than the solid state device 57, and supports roughly the center of the solid state device 57. The lead terminals 67b and the solid state device 57 do not face each other, and the electrode pads 59 of the solid state device 57 and the lead terminals 67b are connected by bonding wires 62.

Referring to FIG. 1 and FIG. 18, with the above-mentioned construction, the function devices 3 provided for the respective semiconductor chips 1 are electrically connected to predetermined lead terminals 67b via the interconnection members 11, the penetrating electrodes 10, the protruding electrodes 63, the rear side protruding electrodes 15, the front side protruding electrode 14, the electrode pads 58, the solid state device 57, the electrode pads 59, and the bonding wires 62.

On the bottom surface of the semiconductor device 66 (surface on which the lead frame 67 is disposed), the lead frame 67 is exposed from the sealing resin 51, and the exposed surface of the lead frame 67 and the surface of the sealing resin 51 are almost flush. The lead terminals 67b are also exposed from the side surface of the semiconductor device 66. The exposed portions of the lead terminals 67b are solder-plated, and via this solder, the semiconductor device 66 can be mounted on an other wiring board, etc.

In a plan view of the supporting part 67a and the solid state device 57 from above in the thickness direction, since the supporting part 67a is formed smaller than the solid state device 57, the spaces between the supporting part 67a and the lead terminals 67b are made wide, and therefore, the supporting part 67a and the lead terminals 67b are prevented from being electrically short-circuited by the solder when mounting.

On the other hand, as long as there is no possibility that the supporting part 67a and the lead terminals 67b are electrically short-circuited by the solder, it is possible that the supporting part 67a is formed larger than the solid state device 57 in a plan view of the supporting part 67a and the solid state device 57 from above in the thickness direction and the spaces between the supporting part 67a and the lead terminals 67b are narrowed.

FIG. 19 is an illustrative sectional view showing the structure of a fifth semiconductor device including a plurality of semiconductor chips 1 shown in FIG. 1. In FIG. 19, portions corresponding to the parts of the semiconductor devices 65 and 66 of FIG. 15 and FIG. 18 are attached with the same reference symbols as in FIG. 15 and FIG. 18 and description thereof is omitted.

This semiconductor device 68 has a structure similar to that of the semiconductor device 66 shown in FIG. 18, however, it does not include the solid state device 57, and on the supporting part 67a, a semiconductor chip 60, a plurality of semiconductor chips 1 and a semiconductor chip 1A are stacked in order. The surfaces of the semiconductor chips 1, 1A, and 60 on which the function devices 3 are formed are all turned toward the opposite side of the supporting part 67a, in this embodiment. Between the supporting part 67a and the semiconductor chip 60, no interlayer sealing member 61 is interposed, and the supporting part 67a and the semiconductor chip 60 are directly joined.

The electrode pads 14P of the semiconductor chip 1A disposed on the top are connected to the lead terminals 67b via boding wires 62.

Referring to FIG. 1 and FIG. 19, with the above-mentioned construction, the function devices 3 provided for the respective semiconductor chips 60, 1, and 1A are electrically connected to predetermined lead terminals 67b via the interconnection members 11, the penetrating electrodes 10, the protruding electrodes 63, the rear side protruding electrodes 15, the front side protruding electrodes 14, the electrode pads 14P and the bonding wires 62.

Description of embodiments of the invention has been given above, however, this invention can be carried out in other modes. For example, in the semiconductor chip 31 shown in FIG. 7, in the case where connection to a wiring board or another semiconductor chip 1, 21, 25, or 31 is made from only one surface side of the semiconductor substrate 2, a concave portion filled with the polymer 32 may be formed in place of the through hole 4, and in this case, it is not necessary to provide the rear side protruding electrode 33 and the conductive film 34.

In FIG. 9(a), FIG. 9(b), FIG. 10(a), FIG. 10(b), and FIG. 11(a) through FIG. 11(c), the planar shapes of the through hole 4, the polymer 32, and the front side protruding electrode 40 are quadrilaterals (almost squares), however, they may be polygons other than quadrilaterals or circulars.

The semiconductor devices 45, 55, 65, 66, and 68 of FIG. 12 through FIG. 19 are all structured in that a plurality of semiconductor chips 1 are stacked, however, it is also possible that in place of the semiconductor chips 1, semiconductor chips 21, 25, 31, 37, 38, or 39 are stacked. Furthermore the semiconductor devices 45, 55, 65, 66, and 68 are examples in which semiconductor chips 1 of the same type are stacked, however, it is also possible that a plurality of semiconductor chips of different types 1, 21, 25, 31, 37, 38, and 39 are stacked.

When the semiconductor devices include the semiconductor chips 31, 37, 38, and 39, high connection reliability can be obtained by easing stresses applied to the junction portions between the semiconductor chips 31, 37, 38, and 39 and other semiconductor chips 1, 21, 25, 31, 37, 38, 39, and 60 or the solid state device 57.

The embodiments of the invention are described in detail above, however, these embodiments are only detailed examples for clarifying the technical contents of the invention, and the invention should not be interpreted as being limited to these detailed examples, and the spirit and scope of the invention are limited only by the accompanying claims.

This application corresponds to Japanese Patent Application No. 2003-406446 filed with the Japanese Patent Office on Dec. 4, 2003, and all disclosures of this application are incorporated herein by reference.

What is claimed is:

1. A semiconductor chip manufacturing method comprising the steps of:
   providing a semiconductor substrate having a front surface and a rear surface, the front surface having a first portion and a second portion;
   forming a function device on the second portion of the front surface;
   forming a concave portion in the semiconductor substrate, the concave portion extending in a thickness direction of the semiconductor substrate from the first portion of the front surface;
   forming an oxidation preventive film made of a first metal material by supplying the first metal material onto an inner wall surface of the concave portion;
   supplying a second metal material containing a metal that is oxidized more easily than the first metal material into the concave portion after the step of forming the oxidation preventive film;
   electrically connecting the second metal material supplied into the concave portion and the function device; and
   thinning the semiconductor substrate, so that the thickness thereof becomes thinner than a depth of the concave portion, by removing the semiconductor substrate from the rear surface without removing the oxidation preventive film, the concave portion being formed into a through hole penetrating the semiconductor substrate in the thickness direction, and so that the second metal material disposed inside the concave portion is formed into both (i) a penetrating electrode that electrically connects the front surface and the rear surface and (ii) a rear side protruding electrode protruding from the rear surface,
   wherein the step of supplying the second metal material into the concave portion and the step of electrically connecting the second metal material and the function device are simultaneously carried out.

2. A semiconductor chip manufacturing method according to claim 1, wherein the first metal material is selected from the group consisting of gold and palladium.

3. A semiconductor chip manufacturing method according to claim 1, further comprising a step of forming an insulating film on the inner wall surface of the concave portion before the step of forming the oxidation preventive film after the step of forming the concave portion.

4. A semiconductor chip manufacturing method according to claim 1, further comprising a step of forming a diffusion preventive film on the inner wall surface of the concave portion before the step of forming the oxidation preventive film after the step of forming the concave portion, the diffusion preventive film restraining diffusion of metal atoms from an inside of the through hole to the semiconductor substrate.

5. A semiconductor chip manufacturing method according to claim 1, further comprising a step of forming an intermetallic diffusion preventive film on the inner wall surface of the concave portion before the step of supplying the second metal material into the concave portion after the step of forming the oxidation preventive film, the intermetallic diffusion preventive film restraining diffusion of metal atoms between the oxidation preventive film and the second metal material.

6. The semiconductor chip manufacturing method according to claim 1, wherein:
the step of forming the oxidation preventive film further includes a step of supplying the first metal material onto the front surface, so that the oxidation preventive covers, without discontinuity, the inner wall surface of the concave portion and at least a portion of the function device formed on the second portion of the front surface; and
the oxidation preventive film electrically connects the second metal material to the function device.

7. A semiconductor chip manufacturing method according to claim 1, wherein:
the second metal material contains a low melting point metal material the solidus temperature of which is in a temperature range of 60° C. or higher and 370° C. or lower; and
the step of supplying the second metal material into the concave portion further includes a step of forming a low melting point metal layer by supplying the low melting point metal material to a bottom of the concave portion.

8. A semiconductor chip manufacturing method according to claim 7, wherein the step of forming the low melting point metal layer includes a step of supplying a low melting point metal paste containing a powder made of the low melting point metal material to the bottom of the concave portion.

9. A semiconductor chip manufacturing method comprising the steps of:
forming hole opened to one surface of a semiconductor substrate on which a function device is formed;
embedding a polymer inside the hole;
forming an interconnection layer electrically connected to the function device on an exposed surface of the polymer embedded inside the hole; and
forming a protruding electrode on the interconnection layer on the polymer.

10. A semiconductor chip manufacturing method according to claim 9, wherein the step of forming the interconnection layer includes a step of forming the interconnection layer so that the polymer is exposed between the edges of the hole and the interconnection layer.

11. A semiconductor chip manufacturing method according to claim 9, wherein
the step of forming the hole includes a step of forming concave portion as the hole,
the function device is formed on the one surface of the semiconductor substrate, and
the semiconductor chip manufacturing method further comprises the steps of:
forming a conductive film electrically connected to the function device by supplying a conductive material to the inner wall surface of the concave portion before the step of embedding the polymer into the concave portion after the step of forming the concave portion; and
thinning the semiconductor substrate so that the thickness thereof is reduced to be thinner than the depth of the concave portion by removing the semiconductor substrate from the other surface different from the one surface, the concave portion is formed into through hole penetrating the semiconductor substrate in the thickness direction, and the conductive film is disposed across the one surface side and the other surface side of the semiconductor substrate.

12. A semiconductor chip, comprising:
a semiconductor substrate having a front surface and a rear surface;
a function device formed on the front surface of the semiconductor substrate;
a penetrating electrode which is disposed inside a through hole penetrating the semiconductor substrate in a thickness direction by a side of the function device, and electrically connects the front surface of the semiconductor substrate and the rear surface of the semiconductor substrate;
an interconnection member electrically connecting the penetrating electrode to the function device, the interconnection member being made of the same material as the penetrating electrode;
a rear side protruding electrode which protrudes from the rear surface of the semiconductor substrate and has a side surface continued to a side surface of the penetrating electrode; and
an oxidation preventive film which covers the rear side protruding electrode, and is disposed between the semiconductor substrate and the penetrating electrode inside the through hole, and is made of an inert metal material.

13. A semiconductor chip according to claim 12, wherein the oxidation preventive film is made of metal selected from the group consisting of gold and palladium.

14. A semiconductor chip according to claim 12, further comprising an insulating film which is disposed between the oxidation preventive film and the semiconductor substrate inside the through hole.

15. A semiconductor chip according to claim 12, further comprising a diffusion preventive film which is disposed between the oxidation preventive film and the semiconductor substrate inside the through hole, and restrains diffusion of metal atoms from an inside of the through hole to the semiconductor substrate.

16. A semiconductor chip according to claim 12, further comprising an intermetallic diffusion preventive film which is disposed between the oxidation preventive film and the penetrating electrode inside the through hole, and restrains diffusion of metal atoms between the oxidation preventive film and the penetrating electrode.

17. A semiconductor chip according to claim 12, wherein at least a tip end side of the rear side protruding electrode is made of low melting point metal layer whose solidus temperature is in a temperature range of 60° C. or higher and 370° C. or lower.

18. The semiconductor chip according to claim 12, wherein the oxidation preventive film covers, without discontinuity, the rear side protruding electrode, the side surface of the penetrating electrode and at least a portion of the function device, and electrically connects the penetrating electrode to the function device.

19. A semiconductor chip comprising:
a semiconductor substrate with a function device formed thereon;
a polymer disposed so as to fill the inside of a hole opened to one surface of the semiconductor substrate;
an interconnection layer which is formed on the polymer embedded inside the hole and electrically connected to the function device; and
a protruding electrode provided on a portion positioned above the polymer of the interconnection layer.

20. A semiconductor chip according to claim 19, wherein the polymer is exposed between the edges of the hole and the interconnection layer.

21. A semiconductor chip comprising:
    a semiconductor substrate with a function device formed thereon;
    a polymer disposed inside a through hole penetrating the semiconductor substrate in the thickness direction;
    an interconnection layer which is formed on the polymer disposed inside the through hole and electrically connected to the function device;
    a protruding electrode provided on a portion positioned above the polymer of the interconnection layer; and
    a conductive film which is disposed across one surface and the other surface of the semiconductor substrate inside the through hole and electrically connected to the function device.

22. A semiconductor device including a plurality of semiconductor chips stacked in the thickness direction, wherein each semiconductor chip comprises:
    a semiconductor substrate having a front surface and a rear surface;
    a function device formed on the front surface of the semiconductor substrate;
    a penetrating electrode which is electrically connected to the function device, disposed inside a through hole penetrating the semiconductor substrate in the thickness direction by the side of the function device, the penetrating electrode electrically connecting the front surface side and the rear surface side of the semiconductor substrate;
    a rear side protruding electrode which protrudes from the rear surface of the semiconductor substrate and has a side surface continued to the side surface of the penetrating electrode; and
    an oxidation preventive film which covers the rear side protruding electrode, and is disposed between the semiconductor substrate and the penetrating electrode inside the through hole and made of an inert metal material.

23. A semiconductor device including a plurality of semiconductor chips stacked in the thickness direction, wherein each semiconductor chip comprises:
    a semiconductor substrate with a function device formed thereon;
    a polymer disposed so as to fill the inside of a hole opened to one surface of the semiconductor substrate;
    an interconnection layer which is formed on the polymer embedded inside the hole and electrically connected to the function device; and
    a protruding electrode provided on a portion positioned above the polymer of the interconnection layer.

24. A semiconductor device including a plurality of semiconductor chips stacked in the thickness direction, wherein each semiconductor chip comprises:
    a semiconductor substrate with a function device formed thereon;
    a polymer disposed inside a through hole penetrating the semiconductor substrate in the thickness direction;
    an interconnection layer which is formed on the polymer disposed inside the through hole and electrically connected to the function device;
    a protruding electrode provided on a portion positioned above the polymer of the interconnection layer; and
    a conductive film which is disposed across one surface and the other surface of the semiconductor substrate inside the through hole and is electrically connected to the function device.

\* \* \* \* \*